(12) United States Patent
Wu et al.

(10) Patent No.: US 10,623,211 B2
(45) Date of Patent: *Apr. 14, 2020

(54) VOLTAGE CORRECTION COMPUTATIONS FOR MEMORY DECISION FEEDBACK EQUALIZERS

(71) Applicant: Micron Technology, Inc., Boise, ID (US)

(72) Inventors: Jun Wu, Shanghai (CN); Dong Pan, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/375,510

(22) Filed: Apr. 4, 2019

(65) Prior Publication Data

US 2019/0229955 A1 Jul. 25, 2019

Related U.S. Application Data

(63) Continuation of application No. 15/871,636, filed on Jan. 15, 2018, now Pat. No. 10,277,427.

(51) Int. Cl.
*G11C 7/10* (2006.01)
*H04L 25/03* (2006.01)
(Continued)

(52) U.S. Cl.
CPC ......... *H04L 25/03019* (2013.01); *G11C 7/02* (2013.01); *G11C 7/1006* (2013.01);
(Continued)

(58) Field of Classification Search
CPC ............. H04L 25/03019; H04L 7/0058; H04L 25/03267; H04L 25/03343; H04L 27/01; G11C 7/1006
See application file for complete search history.

(56) References Cited

U.S. PATENT DOCUMENTS 6,243,369 B1  6/2001  Grimwood et al.
8,126,045 B2  2/2012  Bulzacchelli et al.
(Continued)

OTHER PUBLICATIONS

Chen Zhang, "An Area Efficient 4Gb/s 3-Tap Decision Feedback Equalizer with Current-Integrating Summer," Department of Electrical and Computer Engineering, Northwestern University, Boston, Massachusetts, https://repository.library.northeastern.edu/files/neu:cj82nb42f; Apr. 2016; 90 pages.

*Primary Examiner* — David S Huang
(74) *Attorney, Agent, or Firm* — Fletcher Yoder, P.C.

(57) ABSTRACT

A device includes a first terminal configured to receive a reference voltage, a second terminal configured to receive a weighted tap value, a local generator circuit configured to create a group of unsigned voltage correction values based on the reference voltage and the weighted tap value, and a sign configuring circuit configured to receive the group of unsigned voltage correction values from the local generator circuit and assign a polarity to each respective unsigned voltage correction value of the group of unsigned voltage correction values, creating correction signals from the group of unsigned voltage correction values. The device also includes an output configured to transmit the correction signals to a first input of a processing circuit, wherein the processing circuit is configured to use the correction signals to offset inter-symbol interference from a data stream on a distorted bit based at least on a control signal.

20 Claims, 16 Drawing Sheets

(51) Int. Cl.
  *H04L 7/00*      (2006.01)
  *H04L 27/01*     (2006.01)
  *G11C 7/02*      (2006.01)
  *G11C 11/4076*   (2006.01)
  *G11C 7/22*      (2006.01)
  *G11C 11/4096*   (2006.01)

(52) U.S. Cl.
  CPC .......... *G11C 7/222* (2013.01); *G11C 11/4076* (2013.01); *G11C 11/4096* (2013.01); *H04L 7/0058* (2013.01); *H04L 25/03267* (2013.01); *H04L 25/03343* (2013.01); *H04L 27/01* (2013.01); *G11C 2207/107* (2013.01)

(56) References Cited

U.S. PATENT DOCUMENTS

| | | |
|---|---|---|
| 9,484,967 B1 | 11/2016 | Su et al. |
| 9,722,820 B1 | 8/2017 | Hekmat et al. |
| 2005/0157780 A1 | 7/2005 | Werner et al. |
| 2009/0187807 A1 | 7/2009 | Narasimha et al. |
| 2009/0265406 A1* | 10/2009 | Bosshart ........... H04L 25/03057 708/323 |
| 2012/0201289 A1 | 8/2012 | Abdalla et al. |

* cited by examiner

VOLTAGE CORRECTION COMPUTATIONS FOR MEMORY DECISION FEEDBACK EQUALIZERS

CROSS-REFERENCE TO RELATED APPLICATIONS

Under 35 U.S.C. § 120, this application is a continuation of U.S. patent application Ser. No. 15/871,636, which is entitled "VOLTAGE CORRECTION COMPUTATIONS FOR MEMORY DECISION FEEDBACK EQUALIZERS," filed Jan. 15, 2018, and incorporated by reference herein in its entirety for all purposes.

BACKGROUND

Field of the Invention

Embodiments of the present disclosure relate generally to the field of semiconductor memory devices. More specifically, embodiments of the present disclosure relate to using a decision feedback equalizer (DFE) circuit of a semiconductor memory device to correct distortions in transmitted signals.

Description of the Related Art

The operational rate of memory devices, including the data rate of a memory device, has been increasing over time. As a side effect of the increase in speed of a memory device, data errors due to distortion may increase. For example, inter-symbol interference between transmitted data whereby previously received data influences the currently received data may occur (e.g., previously received data affects and interferes with subsequently received data). One manner to correct for this interference is through the use of a decision feedback equalizer (DFE) circuit, which may be programmed to offset (i.e., undo, mitigate, or offset) the effect of the channel on the transmitted data.

Additionally, correcting distortions in the transmitted signals continues to be important. However, conventional distortion correction techniques may not adequately correct the distortions of the signal. Errors that result from slow processes of conventional distortion correction techniques cause additional distortions to the final data, thus reducing the reliability of data transmitted within the memory devices.

BRIEF DESCRIPTION OF THE DRAWINGS

Various aspects of this disclosure may better be understood upon reading the following detailed description and upon reference to the drawings in which.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Using a feedback equalizer (DFE) of a memory device to perform distortion correction techniques may be valuable, for example, to correctly compensate for distortions in the received data of the memory device. This insures that accurate values are being stored in the memory of the memory device. The INT may use previous bit data to create corrective values to compensate for distortion resulted from the previous bit data. For example, the most recent previous bit may have more of a distortion effect on the current bit than a bit transmitted several data points before, causing the corrective values to be different between the two bits. With these levels to correct for, the DFE may operate to correct the distortion of the transmitted bit.

In some embodiments, the DFE may use multiple bits of previous data to precisely calculate the distortion correction factor. In those embodiments, a system may be used that has all of the corrective voltages calculated prior to receiving the distorted bit and may save time during the process of correction. This technique and associated hardware may allow for multiple bits to be received and processed nearly simultaneously, leading to a very efficient system that may process distortions of received bits more quickly than may be accomplished via traditional DFE solutions.

Figure 1:
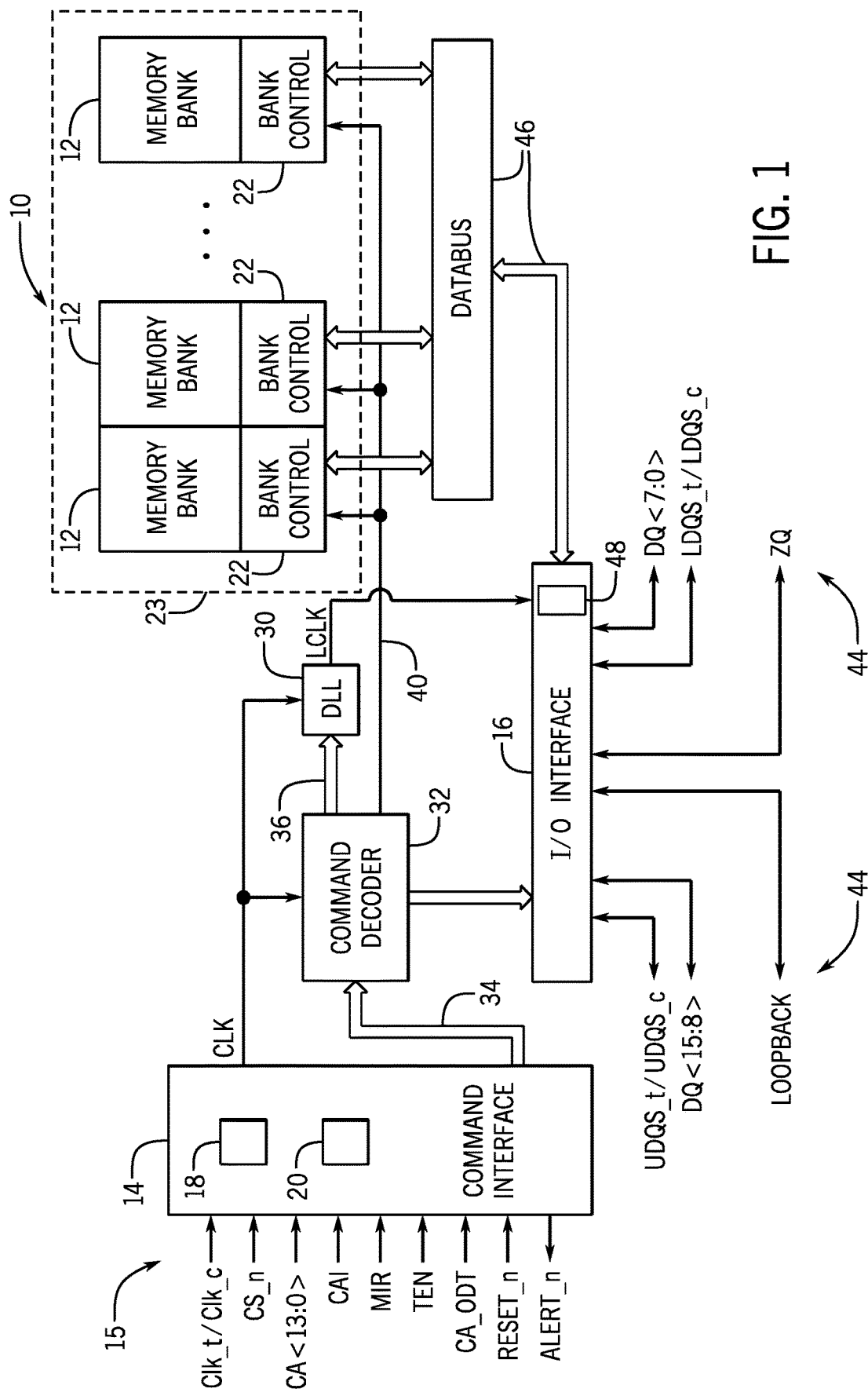
FIG. 1 is a simplified block diagram illustrating certain features of a memory device, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16 configured to exchange (e.g., receive and transmit) signals with external devices. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t/) and the complementary clock signal (Clk_c). The positive clock edge for DDR refers to the point where the rising true clock signal Clk_t/ crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t/) and the complementary clock signal (Clk_c) and generates an internal clock signal CLK. The internal clock signal CLK is supplied to an internal clock generator 30, such as a delay locked loop (DLL) circuit. The internal clock generator 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal clock signal LCLK. The phase controlled internal clock signal LCLK may be used to clock data through the I/O interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12. Collectively, the memory banks 12 and the bank control blocks 22 may be referred to as a memory array 23.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t/and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0> bus. Access to the memory banks 12 within the memory device 10 is encoded on the CA<13:0> bus with the commands.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the I/O interface 16. More specifically, the data may be sent to or retrieved from the memory banks 12 over the data bus 46, which includes a plurality of bi-directional data buses. Data I/O signals, generally referred to as DQ signals, are generally transmitted and received in one or more bi-directional data busses. For certain memory devices, such as a DDR5 SDRAM memory device, the I/O signals may be divided into upper and lower bytes. For instance, for an x16 memory device, the I/O signals may be divided into upper and lower I/O signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t/ and Clk_c), the data strobe (DQS) signals may be provided as a differential pair of data strobe signals (DQS_t/ and DQS_c) to provide differential pair signaling during reads and writes. For certain memory devices, such as a DDR5 SDRAM memory device, the differential pairs of DQS signals may be divided into upper and lower data strobe signals (e.g., UDQS_t/ and UDQS_c; LDQS_t/ and LDQS_c) corresponding to upper and lower bytes of data sent to and from the memory device 10, for instance.

An impedance (ZQ) calibration signal may also be provided to the memory device 10 through the I/O interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the I/O interface 16. The loopback signal may be used during a test or debugging phase to set the memory device 10 into a mode wherein signals are looped back through the memory device 10 through the same pin. For instance, the loopback signal may be used to set the memory device 10 to test the data output of the memory device 10. Loopback may include both a data and a strobe or possibly just a data pin. This is generally intended to be used to monitor the data captured by the memory device 10 at the I/O interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

In some embodiments, the memory device 10 may be disposed in (physically integrated into or otherwise connected to) a host device or otherwise coupled to a host device. The host device may include any one of a desktop computer, laptop computer, pager, cellular phone, personal organizer, portable audio player, control circuit, camera, etc. The host device may also be a network node, such as a router, a server, or a client (e.g., one of the previously-described types of computers). The host device may be some other sort of electronic device, such as a copier, a scanner, a printer, a game console, a television, a set-top video distribution or recording system, a cable box, a personal digital media player, a factory automation system, an automotive computer system, or a medical device. (The terms used to describe these various examples of systems, like many of the other terms used herein, may share some referents and, as such, should not be construed narrowly in virtue of the other items listed.)

The host device may, thus, be a processor-based device, which may include a processor, such as a microprocessor, that controls the processing of system functions and requests in the host. Further, any host processor may comprise a plurality of processors that share system control. The host processor may be coupled directly or indirectly to additional system elements of the host, such that the host processor controls the operation of the host by executing instructions that may be stored within the host or external to the host.

As discussed above, data may be written to and read from the memory device 10, for example, by the host whereby the memory device 10 operates as volatile memory, such as Double Data Rate DRAM (e.g., DDR5 SDRAM). The host may, in some embodiments, also include separate non-volatile memory, such as read-only memory (ROM), PC-RAM, silicon-oxide-nitride-oxide-silicon (SONOS) memory, metal-oxide-nitride-oxide-silicon (MONOS) memory, polysilicon floating gate based memory, and/or other types of flash memory of various architectures (e.g., NAND memory, NOR memory, etc.) as well as other types of memory devices (e.g., storage), such as solid state drives (SSD's), MultimediaMediaCards (MMC's), SecureDigital (SD) cards, CompactFlash (CF) cards, or any other suitable device. Further, it should be appreciated that the host may include one or more external interfaces, such as Universal Serial Bus (USB), Peripheral Component Interconnect (PCI), PCI Express (PCI-E), Small Computer System Interface (SCSI), IEEE 1394 (Firewire), or any other suitable interface as well as one or more input devices to allow a user to input data into the host, for example, buttons, switching elements, a keyboard, a light pen, a stylus, a mouse, and/or a voice recognition system, for instance. The host may optionally also include an output device, such as a display coupled to the processor and a network interface device, such as a Network Interface Card (NIC), for interfacing with a network, such as the Internet. As will be appreciated, the host may include many other components, depending on the application of the host.

The host may operate to transfer data to the memory device 10 for storage and may read data from the memory device 10 to perform various operations at the host. Accordingly, to facilitate these data transmissions, in some embodiments, the I/O interface 16 may include a data transceiver 48 that operates to receive and transmit DQ signals to and from the I/O interface 16.

Figure 2:
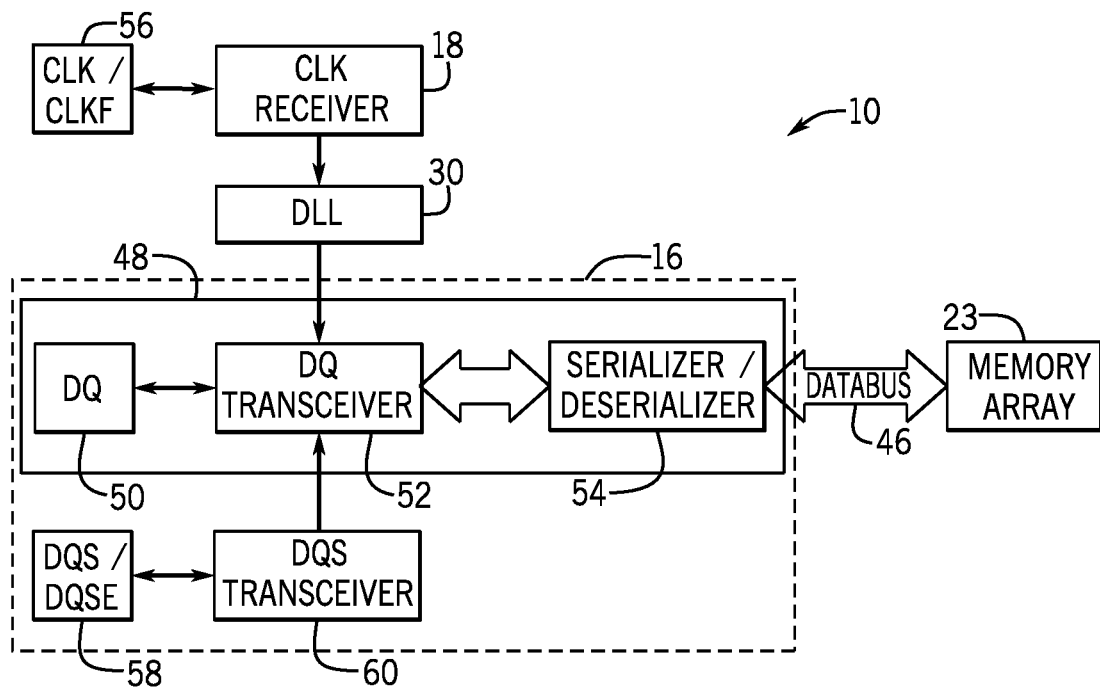
FIG. 2 illustrates a block diagram illustrating a data transceiver of the I/O interface of FIG. 1, according to an embodiment of the present disclosure.

FIG. 2 illustrates the I/O interface 16 of the memory device 10 generally and, more specifically, the data transceiver 48. As illustrated, the data transceiver 48 of the I/O interface 16 may include a DQ connector 50, a DQ transceiver 52, and a serializer/deserializer 54. It should be noted that in some embodiments, multiple data transceivers 48 may be utilized that each single data transceiver 48 may be utilized in connection with a respective one of each of upper and lower I/O signals (e.g., DQ<15:8> and DQ<7:0>) corresponding to upper and lower bytes of the data signals, for instance. Thus, the I/O interface 16 may include a plurality of data transceivers 48, each corresponding to one or more I/O signals (e.g., inclusive of a respective DQ connector 50, DQ transceiver 52, and serializer/deserializer 54).

The DQ connector 50 may be, for example a pin, pad, combination thereof, or another type of interface that operates to receive DQ signals, for example, for transmission of data to the memory array 23 as part of a data write operation. Additionally, the DQ connector 50 may operate to transmit DQ signals from the memory device 10, for example, to transmit data from the memory array 23 as part of a data read operation. To facilitate these data reads/writes, a DQ transceiver 52 is present in data transceiver 48. In some embodiments, for example, the DQ transceiver 52 may receive a clock signal generated by the internal clock generator 30 as a timing signal for determining an output timing of a data read operation from the memory array 23. The clock signal transmitted by the internal clock generator 30 may be based upon one or more clocking signals received by the memory device 10 at clock connector 56 (e.g., a pin, pad, the combination thereof, etc.) and routed to the internal clock generator 30 via the clock input circuit 18. Thus, the DQ transceiver 52 may receive a clock signal generated by the internal clock generator 30 as a timing signal for determining an output timing of a data read operation from the memory array 23.

The DQ transceiver 52 of FIG. 2 may also, for example, receive one or more DQS signals to operate in strobe data mode as part of a data write operation. The DQS signals may be received at a DQS connector 58 (e.g., a pin, pad, the combination thereof, etc.) and routed to the DQ transceiver 52 via a DQS transceiver 60 that operates to control a data strobe mode via selective transmission of the DQS signals to the DQ transceiver 52. Thus, the DQ transceiver 52 may receive DQS signals to control a data write operation from the memory array 23.

As noted above, the data transceiver 48 may operate in modes to facilitate the transfers of the data to and from the memory device 10 (e.g., to and from the memory array 23). For example, to allow for higher data rates within the memory device 10, a data strobe mode in which DQS signals are utilized, may occur. The DQS signals may be driven by an external processor or controller sending the data (e.g., for a write command) as received by the DQS connector 58 (e.g., a pin, pad, the combination thereof, etc.). In some embodiments, the DQS signals are used as clock signals to capture the corresponding input data.

In addition, as illustrated in FIG. 2, the data transceiver 48 also includes a serializer/deserializer 54 that operates to translate serial data bits (e.g., a serial bit stream) into a parallel data bits (e.g., a parallel bit stream) for transmission along data bus 46 during data write operations of the memory device 10. Likewise, the serializer/deserializer 54 operates to translate parallel data bits (e.g., a parallel bit stream) into serial data bits (e.g., a serial bit stream) during read operations of the memory device 10. In this manner, the serializer/deserializer 54 operates to translate data received from, for example, a host device having a serial format into a parallel format suitable for storage in the memory array 23. Likewise, the serializer/deserializer 54 operates to translate data received from, for example, the memory array 23 having a parallel format into a serial format suitable for transmission to a host device.

Figure 3:
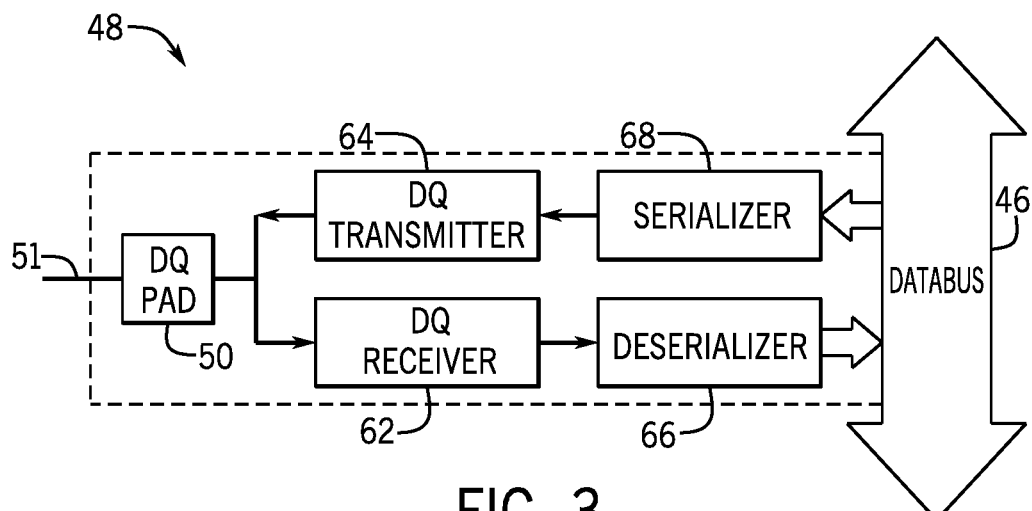
FIG. 3 illustrates a block diagram of an embodiment of the data transceiver of FIG. 2, according to an embodiment of the present disclosure.

FIG. 3 illustrates the data transceiver 48 as including the DQ connector 50 coupled to data transfer bus 51, a DQ receiver 62, a DQ transmitter 64 (which in combination with the DQ receiver 62 forms the DQ transceiver 52), a deserializer 66, and a serializer 68 (which in combination with the deserializer 66 forms the serializer/deserializer 54). In operation, the host (e.g., a host processor or other memory device described above) may operate to transmit data in a serial form across data transfer bus 51 to the data transceiver 48 as part of a data write operation to the memory device 10. This data is received at the DQ connector 50 and transmitted to the DQ receiver 62. The DQ receiver 62, for example, may perform one or more operations on the data (e.g., amplification, driving of the data signals, etc.) and/or may operate as a latch for the data until reception of a respective DQS signal that operates to coordinate (e.g., control) the transmission of the data to the deserializer 66. As part of a data write operation, the deserializer 66 may operate to convert (e.g., translate) data from a format (e.g., a serial form) in which it is transmitted along data transfer bus 51 into a format (e.g., a parallel form) used for transmission of the data to the memory array 23 for storage therein.

Likewise, during a read operation (e.g., reading data from the memory array 23 and transmitting the read data to the host via the data transfer bus 51), the serializer 68 may receive data read from the memory array in one format (e.g., a parallel form) used by the memory array and may convert (e.g., translate) the received data into a second format (e.g., a serial form) so that the data may be compatible with one or more of the data transfer bus 51 and/or the host. The converted data may be transmitted from the serializer 68 to the DQ transmitter 64, whereby one or more operations on the data (e.g., de-amplification, driving of the data signals, etc.) may occur. Additionally, the DQ transmitter 64 may operate as a latch for the received data until reception of a respective clock signal, for example, from the internal clock generator 30, that operates to coordinate (e.g., control) the transmission of the data to the DQ connector 50 for transmission along the data transfer bus 51 to one or more components of the host.

Figure 4:
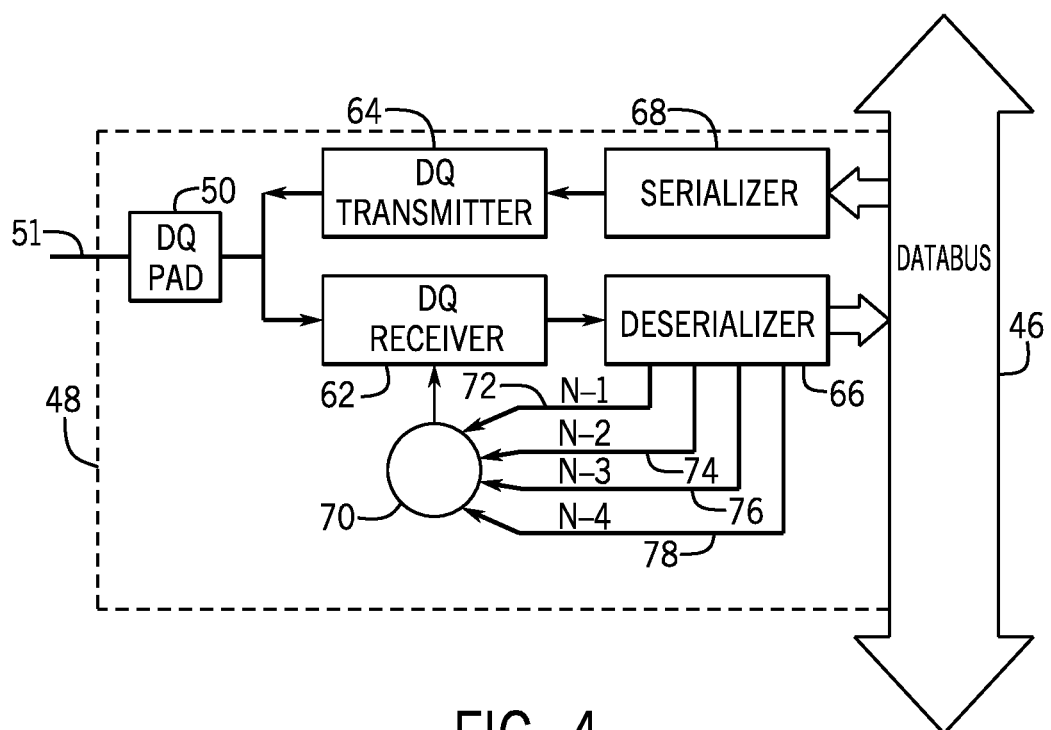
FIG. 4 illustrates a block diagram of a second embodiment of the data transceiver of FIG. 2, according to an embodiment of the present disclosure.

In some embodiments, the data received at the DQ connector 50 may be distorted. For example, data received at the DQ connector 50 may be affected by inter-symbol interference (ISI) in which previously received data interferes with subsequently received data. For example, due to increased data volume being transmitted across the data transfer bus 51 to the DQ connector 50, the data received at the DQ connector 50 may be distorted relative to the data transmitted by the host. One technique to mitigate (e.g., offset or cancel) this distortion and to effectively reverse the effects of ISI is to apply an equalization operation to the data. FIG. 4 illustrates an embodiment of the data transceiver 48 inclusive of an equalizer that may be used in this equalization operation.

FIG. 4 illustrates one embodiment of the data transceiver 48 inclusive of an equalizer, in particular, a decision feedback equalizer (DFE) 70. As illustrated, the DFE 70 is a multi-tap (e.g., four-tap) DFE 70. However, less or more than four taps may be utilized in conjunction with the DFE 70. Likewise, the DFE 70 may be disposed separate from or internal to the deserializer 66 or the DQ receiver 62. In operation, a binary output (e.g., from a latch or decision-making slicer) or an indication of a binary output is captured in one or more data latches or data registers. In the present embodiment, these data latches or data registers may be disposed in the deserializer 66 and the values stored therein may be latched or transmitted along paths 72, 74, 76, and 78.

When a data bit is received at the DQ receiver 62, it may be identified as being transmitted from the host as bit "n" and may be received at a time to as distorted bit n (e.g., bit n having been distorted by ISI). The most recent bit received prior to distorted bit n being received at the DQ receiver 62, e.g., received at time of $t_{-1}$ that immediately precedes time of $t_0$, may be identified as n−1 and is illustrated as being transmitted from a data latch or data register along path 72. The second most recent bit received prior to distorted bit n being received at the DQ receiver 62, e.g., received at time of $t_{-2}$ that immediately precedes time of $t_{-1}$, may be identified as n−2 and is illustrated as being transmitted from a data latch or data register along path 74. The third most recent bit received prior to distorted bit n being received at the DQ receiver 62, e.g., received at time of $t_{-3}$ that immediately precedes time of $t_{-2}$, may be identified as n−3 and is illustrated as being transmitted from a data latch or data register along path 76. The fourth most recent bit received prior to distorted bit n being received at the DQ receiver 62, e.g., received at time of $t_{-3}$ that immediately precedes time of $t_{-2}$, may be identified as n−4 and is illustrated as being transmitted from a data latch or data register along path 78. Bits n−1, n−2, n−3, and n−4 may be considered the group of bits that interfere with received distorted bit n (e.g., bits n−1, n−2, n−3, and n−4 cause ISI to host transmitted bit n) and the DFE 70 may operate to offset the distortion caused by the group of bits n−1, n−2, n−3, and n−4 on host transmitted bit n.

Thus, the values latched or transmitted along paths 72, 74, 76, and 78 may correspond, respectively, to the most recent previous data values (e.g., preceding bits n−1, n−2, n−3, and n−4) transmitted from the DQ receiver 62 to be stored in memory array 23. These previously transmitted bits are fed back along paths 72, 74, 76, and 78 to the DFE 70, which operates to generate weighted taps (e.g., voltages) that may be and added to the received input signal (e.g., data received from the DQ connector 50, such as distorted bit n) by means of a summer (e.g., a summing amplifier). In other embodiments, the weighted taps (e.g., voltages) may be combined with an initial reference value to generate an offset that corresponds to or mitigates the distortion of the received data (e.g., mitigates the distortion of distorted bit n). In some embodiments, taps are weighted to reflect that the most recent previously received data (e.g., bit n−1) may have a stronger influence on the distortion of the received data (e.g., distorted bit n) than bits received at earlier times (e.g., bits n−1, n−2, and n−3). The DFE 70 may operate to generate magnitudes (e.g., unsigned values) and polarities for taps (e.g., voltages) due to each previous bit to collectively offset the distortion caused by those previously received bits.

For example, for the present embodiment, each of previously received bits n−1, n−2, n−3, and n−4 may have one of two values (e.g., a binary 0 or 1), which was transmitted to the deserializer 66 for transmission to the memory array 23 and, additionally, latched or saved in a register for subsequent transmission along respective paths 72, 74, 76, and 78. In the illustrated embodiment, this leads to sixteen (e.g., $2^4$) possible binary combinations (e.g., 0000, 0001, 0010, ..., 1110, or 1111) for the group of bits n−1, n−2, n−3, and n−4. The DFE 70 operates to select and/or generate corresponding tap values for whichever of the aforementioned sixteen combinations are determined to be present (e.g., based on the received values along paths 72, 74, 76, and 78) to be used to adjust either the input value received from the DQ connector 50 (e.g., distorted bit n) or to modify a reference value that is subsequently applied to the input value received from the DQ connector 50 (e.g., distorted bit n) so as to cancel the ISI distortion from the previous bits in the data stream (e.g., the group of bits n−1, n−2, n−3, and n−4).

Use of distortion correction (e.g., a DFE 70) may be beneficial such that data transmitted from the DQ connector 50 is correctly represented in the memory array 23 without distortion. Accordingly, it may be useful to store the previous bit data to use in the distortion correction. As illustrated in the block diagram of FIG. 5, a distortion correction circuit 80 may be included as part of the DQ receiver 62 but may not be physically located therein (e.g., the distortion correction circuit 80 may instead be coupled to the DQ receiver 62). In some embodiments, the distortion correction circuit 80 may be operated to provide previously transmitted bit data to correct a distorted bit 81 (e.g., bit having been distorted by ISI and/or system distortions) transmitted via a channel 84 (e.g., connection, transmission line, and/or conductive material).

The distorted bit 81 may be transmitted to an amplifying device 82 (e.g., variable gain amplifier) from a channel 84. The distorted bit 81 may be transmitted from the amplifying device 82 to the DFE 70, illustrated as having a single weighted tap 86. The distorted bit 81 may be transmitted simultaneously with a DQ reference signal 83 to the DFE 70. The DQ reference signal 83 may represent a threshold value (e.g., a voltage level) for determination if the transmitted bit received by the DQ connection 50 was a logical low (e.g., 0) or a logical high (e.g., 1).

The DFE 70 may be operated to correct the distortion from the distorted bit 81 using the tap weighted with previous bit data (e.g., n−1 bit data). Data (e.g., logical 1 or logical 0) for an n−1 bit may be transmitted through the path 72. The magnitudes and polarities of the single weighted tap 86 may offset the total distortion caused by the n−1 bit via summer circuit 85, which operates as a current summer that applies current to the distorted bit 81 to offset for distortion caused by the n−1 bit. For example, if the received bit at the DQ connection 50 is determined to be below the DQ reference signal 83, the distorted bit 81 is transmitted to the memory array 23 as a logical low. The magnitude and polarity of the weighted tap 86 may be able to correct the distorted bit 81 and the DQ reference signal 83.

A modified version of the distorted bit 81 and a modified version of the DQ reference signal 83 may be transmitted to a latching element (e.g., a regenerative latch, a slicer, etc.) illustrated as data latch 94. A corrected bit 88 (e.g., a modified value of the distorted bit) may be generated via the data latch 94 and transmitted from the data latch 94 to the deserializer 66, which may occur on the rising edge of the DQS signal 96. In other embodiments, variations of the clocking scheme may be followed to be inclusive of additional or alternative methods of data transmission. The value for the new n−1 bit may be stored, for example, in the deserializer 66 for transmission along the path 72 when the corrected bit 88 is received in the deserializer 66. The distortion correction circuitry associated with the DFE 70 and the amplifying device 82 may be described in greater detail below.

Figure 5:
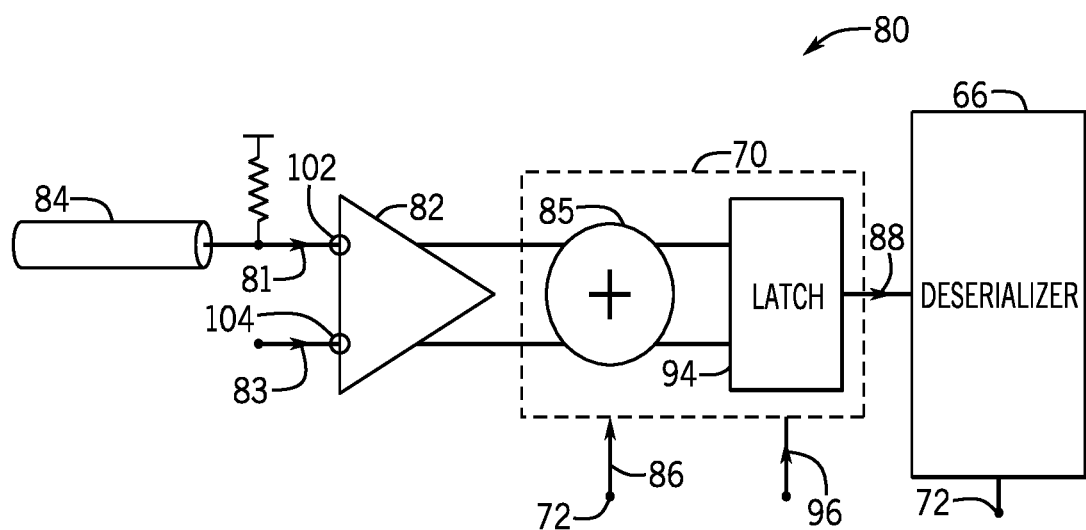
FIG. 5 illustrates a block diagram of a distortion correction circuit, according to an embodiment of the present disclosure.
Figure 6:
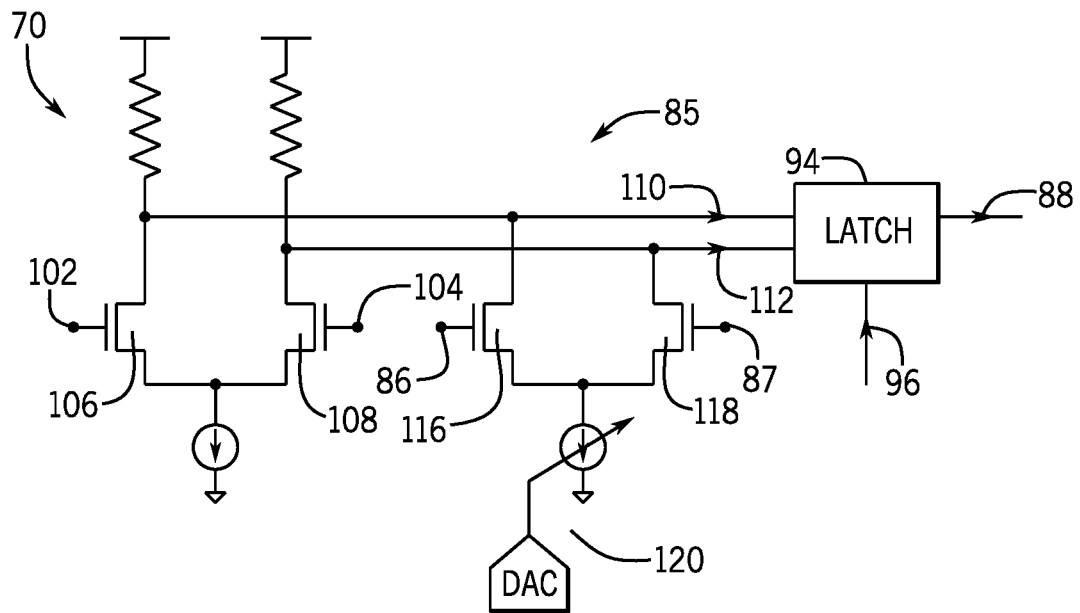
FIG. 6 illustrates a circuit diagram of a portion of the decision feedback equalizer (DFE), according to an embodiment of the present disclosure.

FIG. 6 illustrates a circuit diagram of a portion of the DFE 70 of FIG. 5 that may negate distortions associated with the distorted bit 81. Data bits may be received at a first input 102 and a second input 104 to the summer circuit 85. The first input 102 and the second input 104 may be communicatively coupled to a device that may be enabled or disabled (e.g., coupled to supply a gate signal to the field effect transistors 106 and 108). The distorted bit 81 may be received by the first input 102 and the DQ reference signal 83 may be received by the second input 104. In this manner, two of the field effect transistors 106 and 108 may be controlled by the distorted bit 81 and the DQ reference signal 83.

The weighted tap 86 and its inverse value (e.g., inverse weighted tap 87) may be transmitted to the outputs 110 and 112 to correct the distortion in the distorted bit 81. A logical high for the n−1 bit is transmitted through the path 72. In this case, the n−1 bit may be implemented to generate the weighted tap 86 and the inverse weighted tap 87 as a control signal for two field effect transistors 116 and 118 enabling the contribution of the weighted taps 86 and 87 to the outputs 110 and 112.

The weighted taps 86 and 87 may allow for current to be applied to outputs 110 and 112, whereby the current supplied is controlled through a controllable source 120 (e.g., a current source controlled by a digital to analog converter). The outputs 110 and 112 may be modified values of one or more of the DQ reference signal 83 and the distorted bit 81 and may be transmitted to the data latch 94 (e.g., a regenerative latch or slicer that generates a binary output). The corrected bit 88 may be generated via the data latch 94 based on the outputs 110 and 112 and may be transmitted to the deserializer 66 on the rising edge of the DQS signal 96. The n−1 bit information stored for transmission along the path 72 in the deserializer 66 may be updated with the corrected bit 88 for future distortion corrections.

Figure 7:
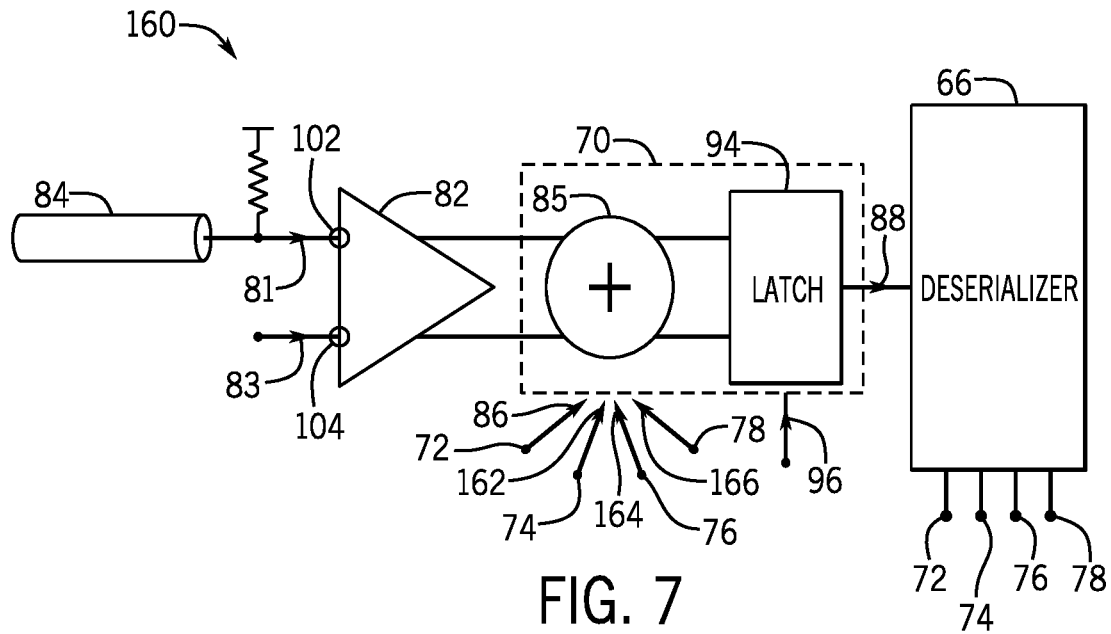
FIG. 7 illustrates a second embodiment of a distortion correction circuit, according to an embodiment of the present disclosure.

In some applications, it may be desired that the corrected bit 88 have a greater level of precision of adjustment than the weighted taps 86 and 87 may otherwise provide. FIG. 7 illustrates a block diagram of a distortion correction circuit 160 that may receive four bits of previous data (e.g., n−1 bit data, n−2 bit data, n−3 bit data, and n−4 bit data) to create four weighted taps 86, 162, 164, and 166 to perform a more precise distortion correction to the distorted bit 81. In a similar manner to the distortion correction circuit 80, the distorted bit 81 may be transmitted to the amplifying device 82 via the channel 84. The DQ reference signal 83 may also be transmitted to the amplifying device 82.

From the amplifying device 82, the distorted bit 81 and the DQ reference signal 83 may be transmitted to the DFE 70. Bit data for the previous bits may be transmitted through the paths 72, 74, 76, and 78. The DFE 70 may be operated to correct the distortion from the distorted bit 81 using the four weighted taps 86, 162, 164, and 166 created from the bit data for the four previous bits. The DFE 70 may be operated to generate magnitudes and polarities for each of the weighted taps 86, 162, 164, and 166 for each of the previous bits transmitted along paths 72, 74, 76, and 78 which may be designed to offset the total distortion to the distorted bit 81 caused by the previously received bits.

One or more of a modified version of the distorted bit 81 and a modified version of the DQ reference signal 83 may be transmitted to the data latch 94. The corrected bit 88 may be transmitted to the deserializer 66 on the rising edge of the DQS signal 96 from the data latch 94. The deserializer 66 may be updated with the values for the n−1 bit, n−2 bit, n−3 bit, and the n−4 bit and the values may be stored for transmission along the paths 72, 74, 76, and 78. The distortion correction circuitry associated with the DFE 70 may be described in greater detail below.

Figure 8:
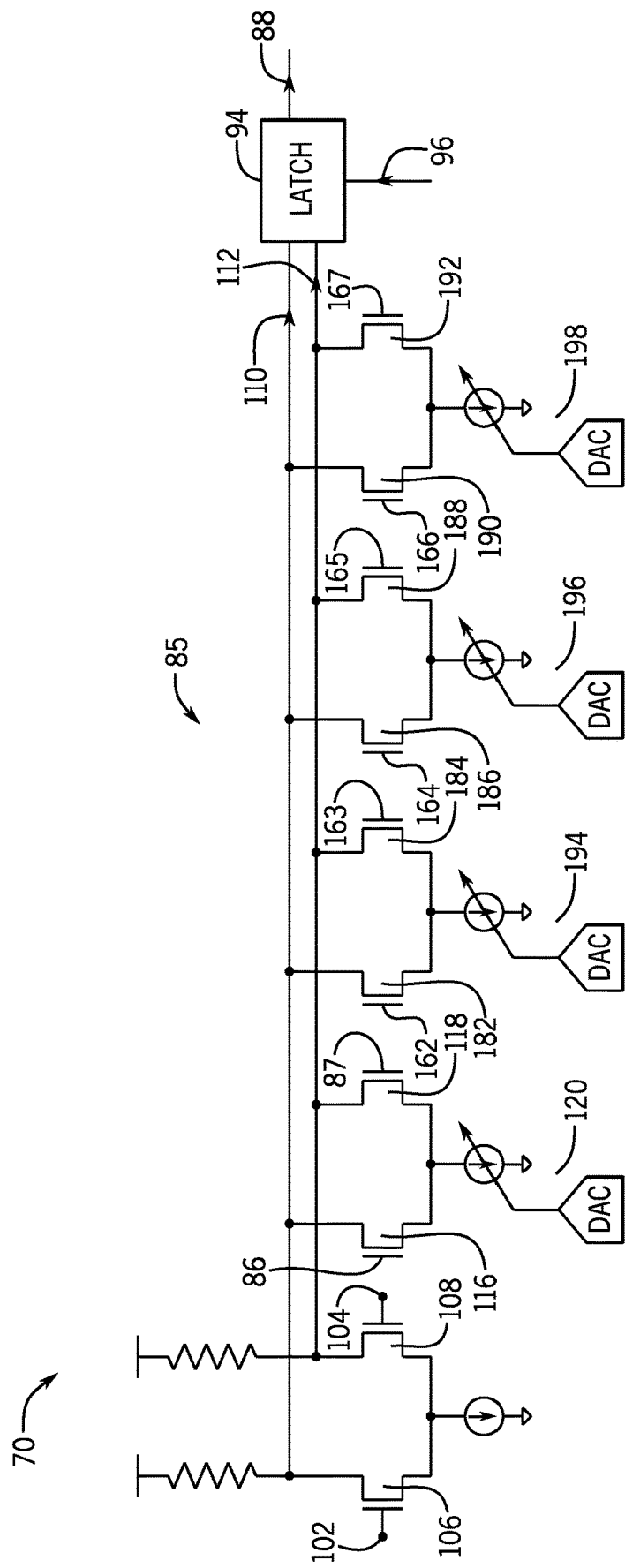
FIG. 8 illustrates a circuit diagram of a portion of the DFE of FIG. 7, according to an embodiment of the present disclosure.

FIG. 8 illustrates a circuit diagram of a portion of the DFE 70 of FIG. 7 that may negate distortions. As additionally illustrated in FIG. 8, the DFE 70 may receive a logical high or low for the n−1 bit, the n−2 bit, the n−3 bit, or the n−4 bit, or any combination therein through the data transmitted on paths 72, 74, 76, and 78. In this case, data transmitted along the paths 72, 74, 76, and 78 may be implemented to generate the weighted taps 86, 162, 164, and 166 and the inverse weighted taps 87, 163, 165, and 167 as control signals for the field effect transistors 116, 118, 182, 184, 186, 188, 190, and 192 to control outputs therefrom transmitted to the outputs 110 and 112. The field effect transistors 116, 118, 182, 184, 186, 188, 190, and 192 may be selectively and controllably activated to reflect one of the sixteen (e.g., $2^4$) different possible binary states represented by the various combinations of previously corrected bits (e.g., 0000, 0001, 0010, . . . 1111).

The weighted taps 86, 87, 162, 163, 164, 166 and 167 may be applied to the outputs 110 and 112, whereby the current supplied is controlled through the controllable source 120 and additional controllable sources 194, 196, and 198 (e.g., a current source controlled by a digital to analog converter).

The outputs 110 and 112 may be transmitted to the data latch 94. The corrected bit 88 may be generated via the data latch 94 based upon the outputs 110 and 112 and may be transmitted to the deserializer 66 on the rising edge of the DQS signal 96. The n−1 bit, the n−2 bit, the n−3 bit, and the n−4 bit information stored for transmission along the paths 72, 74, 76, and 78 in the deserializer 66 may be updated with the corrected bit 88 (e.g., n−4 bit will update to reflect n−3 data, n−3 bit will update to reflect n−2 data, n−2 data will update to reflect n−1 data, and n−1 data will update with the newly corrected bit) for future distortion corrections.

Figure 9:
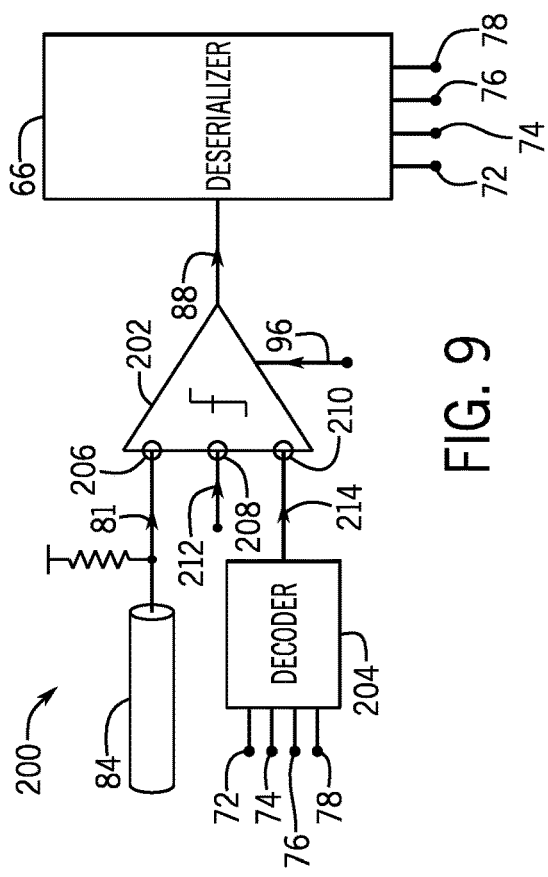
FIG. 9 illustrates a third embodiment of a distortion correction circuit, according to an embodiment of the present disclosure.

In some embodiments, a method of distortion correction that may avoid the amplifying device 82 may be desired. FIG. 9 shows a block diagram of a distortion correction circuit 200 that may avoid using the amplifying device 82. The distortion correction circuit 200 includes an equalizer 202 (e.g., regenerative latch circuitry and DFE circuitry combined into one device) and a decoder 204 (e.g., four to sixteen bit decoder). The distorted bit 81 may be received via the channel 84. The distorted bit 81 may be received by the equalizer 202 at a terminal 206. The circuitry of the DFE 70 may be included within the equalizer 202. A decoded signal 214 (e.g., a control signal) and voltage correction signals 212 (e.g., a weighted or otherwise adjusted version of the DQ reference signal 83) may also be received by the equalizer 202.

The decoded signal 214 may be transmitted to the equalizer 202 at a terminal 210. A four bit sequence represented by the data on paths 72, 74, 76, and 78 (e.g., 0000, 0001, ... 1111) may be converted by the decoder 204 into one of sixteen possible states which may be outputted to as the decoded signal 214 (e.g., 0000000000000001, 0000000000000010, ... 1000000000000000). The sixteen possible states may correspond to all possible combinations of the four corrective previous bits of data (e.g., $2^4$). In additional embodiments, more or less than four corrective previous bits of data may be used to create the decoded signal 214. In other embodiments, in place of being directly coupled, the paths 72, 74, 76, and 78 may be represented with weighted taps 86, 162, 164, and 166 as inputs into the decoder 204. One or more voltage correction signals 212 corresponding to the different states indicated by the decoded signal 214 may be transmitted to a terminal 208.

The value of the distorted bit 81 may be corrected by the equalizer 202. The correction may be performed such that an output from the equalizer 202 is the corrected bit 88. The corrected bit 88 may be sent to the deserializer 66 on the rising edge of the DQS signal 96. In the deserializer 66, the n−1 bit, the n−2 bit, the n−3 bit, and the n−4 bit stored may be updated in accordance with the new data (e.g., n−4 bit will update to reflect n−3 data, n−3 bit will update to reflect n−2 data, n−2 data will update to reflect n−1 data, and n−1 data will update with the newly corrected bit) for use in future distortion corrections.

The method exemplified by the distortion correction circuit 200 may result in an increased speed of distortion correction. Rather than perform a summing function every time the distortion correction circuit 200 determines the resulting distortion correction factor, or distortion correction value, the distortion correction circuit 200 may have stored distortion correction values. The distortion correction value may have been stored such that the value may be already ready to be used in the distortion correction. The means of implementation of the stored values may be elaborated on in FIG. 10.

Figure 10:
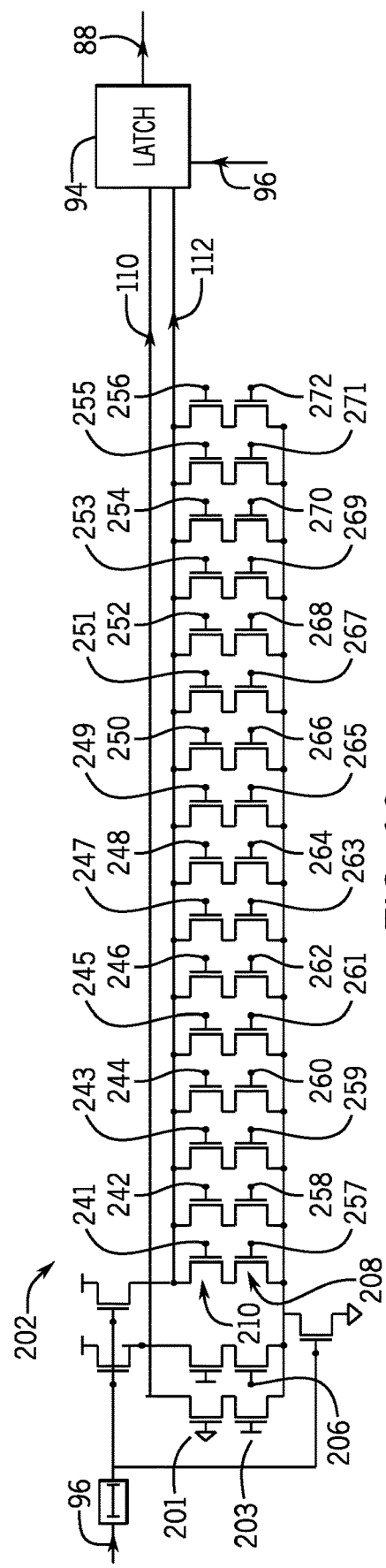
FIG. 10 illustrates a circuit diagram of the equalizer of FIG. 9, according to an embodiment of the present disclosure.

FIG. 10 illustrates a circuit diagram of a portion of the equalizer 202 of FIG. 9. The distorted bit 81 may be received at terminal 206 and sent to the output 110. The decoded signal 214 may be transmitted to the terminal 210. The connection between the decoder 204 and the terminal 210 may be made such that when the decoded signal 214 is transmitted to the terminal 210, the correct field effect transistor may be enabled. The correct field effect transistor may be enabled if it corresponds to the specific state specified by the decoded signal 214. A field effect transistor 241-256 specific to each possible state indicated by the decoded signal 214 (e.g., sixteen field effect transistors correspond to sixteen possible states) may be included in the terminal 210. For example, the decoded signal 214, 0000000000000001, may correspond to the first state of the decoded signal 214 and to the associated first field effect transistor 241, which may be the correct field effect transistor enabled upon reception of the decoded signal 214. Additionally, for example, 0000000000000010 may correspond to the second state of the decoded signal 214 and may not enable the first field effect transistor but rather may only enable a second field effect transistor 242. When enabled, the associated corrective voltages coupled through the field effect transistors 257-272 may be transmitted to affect the output 112 by the correct field effect transistor 241-256 for the specific state. For example, 0000000000000010 may correspond to the second state of the decoded signal 214 and may enable a second field effect transistor 242 allowing the associated corrective voltage coupled to the field effect transistor 258 to affect the output 112.

Figure 11:
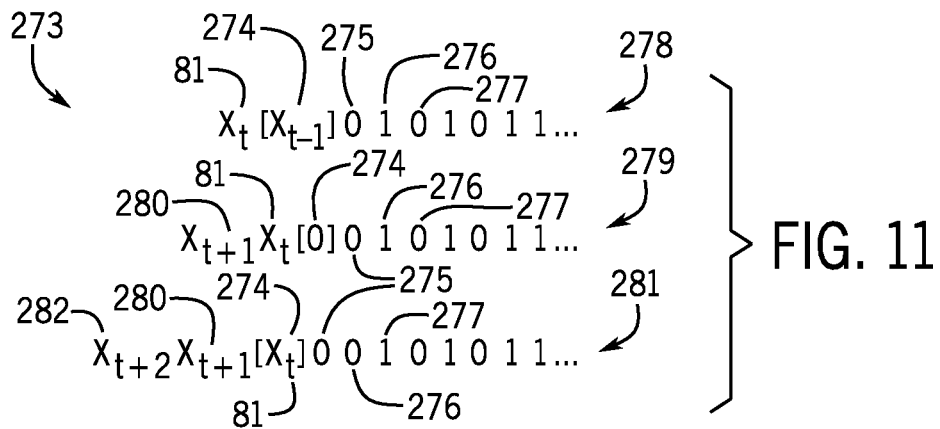
FIG. 11 illustrates a diagram of a bitstream that may be communicated, according to an embodiment of the present disclosure.

The outputs 110 and 112 may be transmitted to the data latch 94. The corrected bit 88 may be generated via the data latch 94 based upon the outputs 110 and 112 and may be transmitted to the deserializer 66 on the rising edge of DQS signal 96. In the deserializer 66, the n−1 bit, the n−2 bit, the n−3 bit, and the n−4 bit stored may be updated in accordance with the new data for use in future distortion corrections. In some embodiments, it may be desirable to test the circuit performance through the simulation of load requirements (e.g., via "dummy" load, e-load, electronic load, current sink). Simulation of load requirements may be performed using the connections provided at field effect transistors 201 and 203. In some embodiments it may be desirable to increase the rate at which the data is transmitted. FIG. 11 illustrates one technique for handling data transmitted at high rates while still allowing for correct processing by the DQ receiver 62.

FIG. 11 illustrates a data stream 273 transmitted to the DQ receiver 62 at three different times and includes the distorted bit 81 received, the n−1 bit 274, the n−2 bit 275, the n−3 bit 276, and the n−4 bit 277. A first bitstream 278 may be the data stream 273 transmitted at t=0. Enough time may not have passed between the transmission of the n−1 bit 274 and the reception of the distorted bit 81 to allow for calculation of the distortion contribution of the n−1 bit 274. If this occurs, one solution may be to wait for the n−1 bit 274 information to complete transmitting to the deserializer 66 so it may be used in the distortion calculation.

A second bitstream 279 may be the data stream 273 transmitted at t=1. The second bitstream 279 may illustrate the distorted bit 81 received and a second distorted bit 280 received. Enough time may have passed to allow for the n−1 bit 274 to be known to the deserializer 66 but it has not yet been applied to aid in the correction determination of the value of the distorted bit 81. A third bitstream 281 may be the data stream 273 transmitted at t=2. The third bitstream 281 may show the second distorted bit 280 to be received at the DQ receiver 62 and a third distorted bit 282 to be received at the DQ receiver 62. However not enough time has passed for the distorted bit 81 to become the corrected bit 88 and to be received in the deserializer 66 as the new n−1 bit 274 information to correct the distortion of the second distorted bit 280. Thus, as with the second bitstream 279 at t=1, the distortion calculation is delayed until the n−1 bit 274 may be received in the deserializer 66 and be transmitted for distortion correction. There may exist a more time efficient solution than waiting for the n−1 bit 274 to transmit without performing any additional processes during the waiting time.

Figure 12:
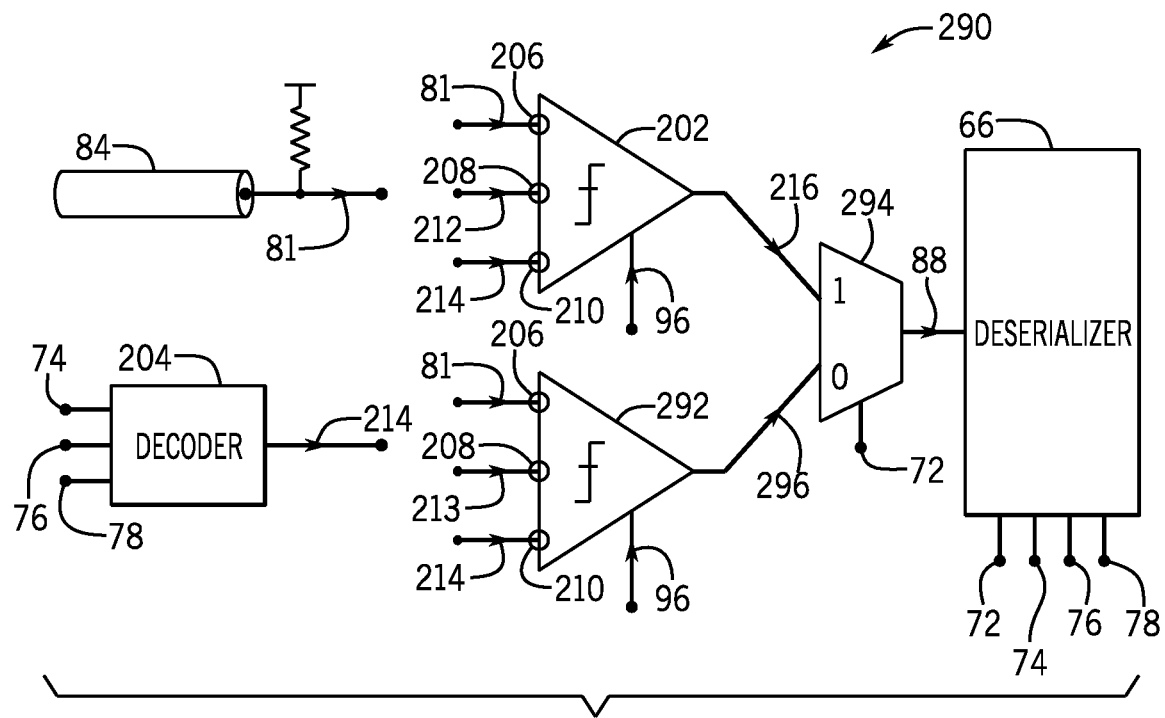
FIG. 12 illustrates a fourth embodiment of a distortion correction circuit, according to an embodiment of the present disclosure.

One solution may be calculating the distortion contribution of the n−2 bit, the n−3 bit, and the n−4 bit using both possibilities of values of the n−1 bit (e.g., logical high and logical low) and to discard the incorrect distortion when the n−1 bit is known. FIG. 12 illustrates a distortion correction circuit 290 which may implement this solution.

FIG. 12 illustrates a block diagram of the distortion correction circuit 290 which may implement an efficient solution for handling data transmitted faster than otherwise may be processed. The distortion correction circuit 290 includes the components of the distortion correction circuit 200 in addition to an equalizer 292 and a selection device 294 (e.g., a multiplexer). The distorted bit 81 may be transmitted to the terminal 206 of the equalizer 202 as well as to the terminal 206 of the equalizer 292. The decoder 204 may be a three to eight decoder and may output the decoded signal 214.

In this embodiment, the decoded signal 214 may be an eight (e.g., $2^3$) bit state representation based on the combination of three bits from the paths 74, 76, and 78 received (e.g., for the example of three bits, 000 may correspond to 00000001 and/or 111 may correspond to 10000000) or their respective associated weight values. The path 72 may not be used in the decoder 204 because the true value of the n−1 bit has not yet been transmitted to the deserializer 66 for transmission along the path 72. The value of the n−1 bit transmitted along the path 72 may be assumed to be high for use in the equalizer 202 and low for use in the equalizer 292. The decoded signal 214 may be transmitted to the terminal 210 of the equalizers 202 and 292. One or more voltage correction signals 212 and 213 corresponding to the different states created by the decoder 204 may be transmitted to the terminal 208.

The voltage correction signals 212, transmitted to the equalizer 202, may be different than the voltage correction signals 213, transmitted to the equalizer 292. The equalizer 202 may receive the voltage correction signals corresponding to binary codes 1000 through 1111 since the equalizer 202 represents the n−1 bit being a logical high. The equalizer 292 may receive the voltage correction signals corresponding to binary codes 0000 through 0111 since the equalizer 292 represents the n−1 bit being a logical low.

The equalizers 202 and 292 may correct the distortion associated with the distorted bit 81, using the three inputs at the terminals 206, 208, and 210. This may be done in such a way that the output 216 from the equalizer 202 represents the corrected bit 88 for if the n−1 bit is a logical high and the output 296 from the equalizer 292 represents the corrected bit 88 if the n−1 bit is a logical low.

Once outputs 296 and 216 are transmitted to the selection device 294, enough time may have passed for the n−1 bit to be transmitted to the deserializer 66 and to the selection device 294. The n−1 bit transmitted along the path 72 may be used to select the corrected bit 88 from the outputs 216 and 296. If the n−1 bit is logical high, the output 216 may be selected as being the corrected bit 88. However, if the n−1 bit is logical low, the output 296 may be selected as being the corrected bit 88. The output from the selection device 294 may be sent to the deserializer 66 as the corrected bit 88. In the deserializer 66, the n−1 bit, the n−2 bit, the n−3 bit, and the n−4 bit may be updated in accordance with the corrected bit 88 (e.g., n−4 bit will update to reflect n−3 data, n−3 bit will update to reflect n−2 data, n−2 data will update to reflect n−1 data, and n−1 data will update with the newly corrected bit). It may be noted that the corrected bit 88 may not complete transmission and updating of all values prior to the reception of the second distorted bit 280, thus the method of waiting, as described, may be repeated.

Figure 13:
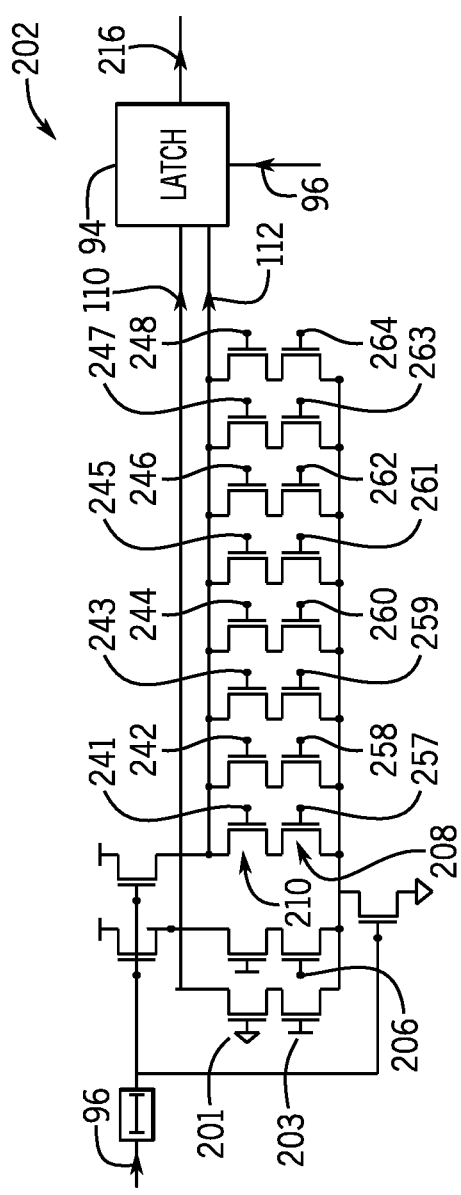
FIG. 13 illustrates a circuit diagram of the equalizer of FIG. 12, according to an embodiment of the present disclosure.
Figure 13:
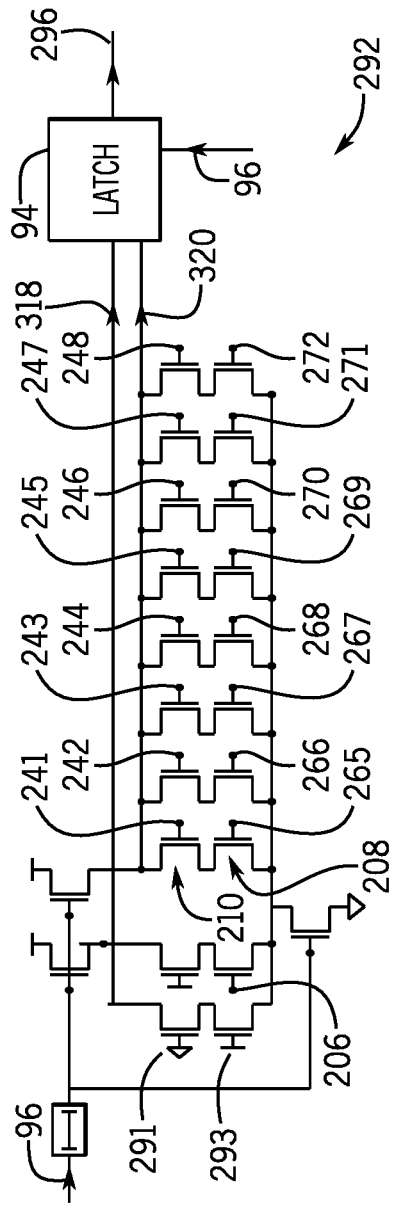

FIG. 13 illustrates a circuit diagram for a portion of the equalizers 202 and 292 of FIG. 12. The distorted bit 81 may be received at the terminal 206 and sent to the output 110 and an output 318.

The decoded signal 214 may be transmitted to the terminal 210. The connection between the decoder 204 and the terminal 210 is such that when the decoded signal 214 transmits to the terminal 210, the correct field effect transistor may be enabled. The correct field effect transistor may be enabled as corresponding to the specific state indicated by the decoded signal 214 (e.g., 00000010 may indicate the second state and result in enabling the second field effect transistor 242 of both the equalizers 202 and 292). Field effect transistors 241-248 specific to each possible state of the decoder 204 (e.g., eight field effect transistors correspond to eight possible states) may be included in the first row of the equalizers 202 and 292 When enabled, the associated corrective voltages coupled through the field effect transistors 257-272 may be transmitted to affect the outputs 110 and 112 by the correct field effect transistor 241-248 for the specific state.

The decoded signal 214 may be transmitted to the terminal 210. The decoded signal 214 may represent two sets of eight states (e.g., 10000000 may enable an eighth state transistor as well as a sixteenth state transistor). The same decoded signal 214 may be used in both of the equalizers 202 and 292 in conjunction with different corrective voltages and field effect transistors to create the two sets of eight states. Due to the nature of performing the parallel distortion correction for both the n−1 bit being logical high and logical low, the decoded signal 214 may be used to indicate the state when the n−1 bit is logical high through the field effect transistors 241-248 of the equalizer 202 and when the n−1 bit is logical low through the field effect transistors 241-248 of the equalizer 292.

When the most significant bit of the binary representation of the previous bits is forced into either a logical high or logical low value, the range of states may be fixed. For example, when the n−1 bit is low (e.g., forced to 0XXX), the maximum binary representation that may occur is 0111 and a maximum of eight (e.g., $2^3$) possible states of representation exist (e.g., 0000, 0001, 0010, 0011, 0100, 0101, 0110, 0111). By changing the logical low to a logical high, a separate and second set of states may be created (e.g., 1000, 1001, 1010, 1011, 1100, 1101, 1110, 1111) to account for a total of sixteen (e.g., $2^4$) possible states. There may be one binary digit separating the first eight states from the second eight states. The separation of states between when the n−1 bit is logical high and when the n−1 bit is logical low may be made between the equalizers 202 and 292, since one equalizer may be designated for correcting distortion caused by the most significant bit of the previous bits being a logical high and the other may be designated for a logical low. The final decision between the two signals may be made by the selection device 294 and may be dependent on what the value of the n−1 bit is at the time of selection.

For example, the eighth field effect transistor 248 may be enabled in both of the equalizers 202 and 292. The eighth state option for the decoded signal 214 (e.g., 10000000) may have transmitted to the equalizer 202, representing the eighth state if the n−1 bit was logical low and the other bits were logical high (e.g., 0111), and to the equalizer 292, representing the sixteenth state if the n−1 bit was logical high and the other bits were logical high (e.g., 1111). This results in one decoded signal 214 affecting the two outputs 216 and 296 through enabling the field effect transistor 248 in the two different equalizers 202 and 292.

Potentially different voltage correction values by be transmitted by the voltage correction signals 212 and 213 to the terminal 208 on the equalizers 202 and 292. When enabled by the decoded signal 214, the correct field effect transistor for the indicated state may be allowed to have the associated corrective voltages from the voltage correction signals 212 and 213 affect the output 112 and an output 320. The outputs 110, 112, 318, and 320 may be transmitted through the data latch 94 circuitry. The outputs 216 and 296 may be sent to the selection device 294 on the rising edge of the DQS signal 96 for the corrected bit 88 selection by the n−1 bit. In some embodiments, it may be desired to simulate load requirements, as described earlier, through the connections provided at field effect transistors 201, 203, 291, and/or 293.

In some embodiments, it may be desired to compensate for limited transmission bandwidth at the DQ receiver 62. The solution may lie in adding duplicates of the equalizers 202 and 292 and selection devices 294 that may allow for rapid computing of distortion correction values.

Figure 14:
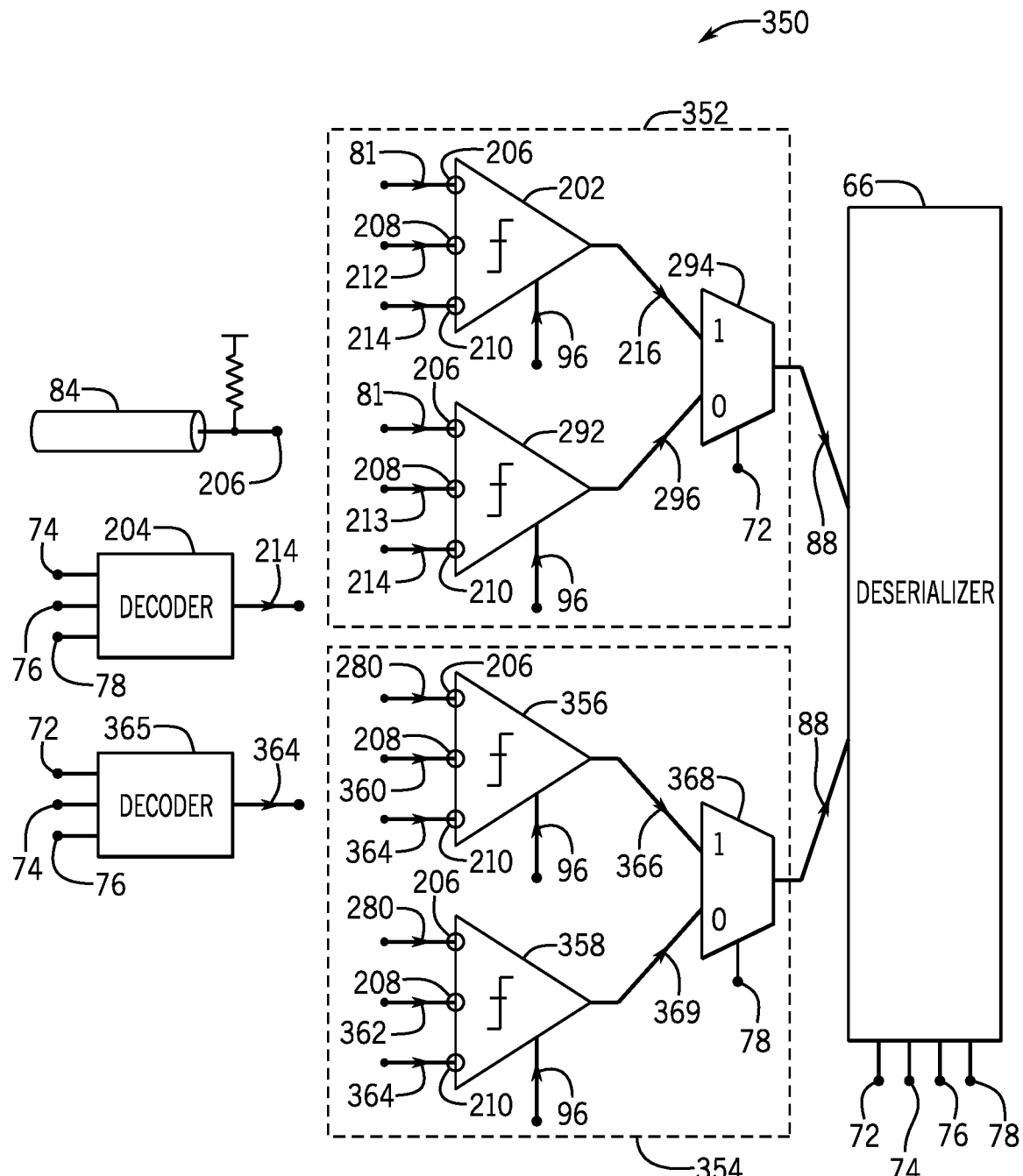
FIG. 14 illustrates a fifth embodiment of a distortion correction circuit, according to an embodiment of the present disclosure.

FIG. 14 illustrates a block diagram of a distortion correction circuit 350 which may compensate for transmission bandwidth and includes two duplications of the distortion correction circuit 290, a first circuit 352 and a second circuit 354, with modification to the inputs. The first circuit 352 may be operated in a similar manner as described above with respect to the distortion correction circuit 290. In the same manner as in the first circuit 352, the second circuit 354 may have received the second distorted bit 280 to the terminals 206, voltage correction signals transmitted on paths 360 and 362 to the terminals 208, and a decoded signal 364 to the terminals 210. As described above, to compensate for limited transmission bandwidth, a method of rolling the distorted bit 81 received between the first circuit 352 and the second circuit 354 may be followed as a method of alleviating a backup of distorted bits 81 resulting from limited transmission bandwidth. In this way, as the distorted bit 81 is being processed in the first circuit 352 in a first iteration of distortion correction, the second distorted bit may be received in the second circuit 354 to start a second iteration of distortion correction. This allows the second iteration of distortion correction to occur while the first iteration of distortion correction is completing. As such, the first iteration may be completed before the third distorted bit 282 is received at the channel 84, this occurs in a manner that allows the third distorted bit 282 to be rolled back to the first circuit 352 for a third iteration of distortion correction. FIG. 14 will be elaborated on to provide more information on the method of rolling the distorted bit 81 received.

The voltage correction signals 360 may be different from the voltage correction signals 362. The voltage correction signals 360 and 362 may be different than the voltage corrections signals 212 and 213. The voltage correction signals 360 and 362 may have assigned corrective voltage values to the sixteen different states as a method to individually weight the influence of each of the four previous bits on the total distortion of the distorted bit 81 without having to recalculate the corrective voltage values each time a distortion correction may occur. The sixteen possible states (e.g., $2^4$) may have resulted in different amounts of distortion to the second distorted bit 280. In this way, the sixteen distortion values may be represented by two voltage corrective signals, where voltage corrective signal 362 may represent the first through the eighth values and the voltage corrective signal 360 may represent the ninth through the sixteenth values. The representation may be derived from the equalizer 356 representing the bit distortion correction when the n−1 bit is logical high (e.g., 1XXX) and the equalizer 358 representing the bit distortion correction when the n−1 bit is logical low (e.g., 0XXX). When the most significant bit is forced into either a logical high or logical low value, this fixes the range of states. For example, when the n−1 bit is logical low, (e.g., forced to 0XXX), the maximum binary representation that may occur is 0111, meaning that a maximum of eight possible states of representation exist (e.g., 0000, 0001, 0010, 0011, 0100, 0101, 0110, 0111).

The decoded signal 364 may be created in a similar way as the decoded signal 214. The decoded signal 364 may result from the n−2 bit, the n−3 bit, and the n−4 bit inputs transmitted along the paths 72, 74, and 76 to a decoder 365, while the n−1 bit transmitted along the path 78 may be used to determine the final correct bit with a selection device 368. It may be important to note that the previous bits may be stored for transmission along the paths 72, 74, 76, and 78 in any order as long as during the distortion correction, the proper previous bit order is observed (e.g., n−1 bit as the most significant bit and the n−4 bit as the least significant bit). The decoded signal 364 may still be an eight bit representation of one of eight possible states. An output 366 may be representative of the second distorted bit 280 corrected of the distortion caused by the n−2 bit, the n−3 bit, and the n−4 bit, but with the n−1 bit being a logical high. An output 369 may be representative of the second distorted bit 280 corrected of the distortion caused by the n−2 bit, the n−3 bit, and the n−4 bit, but with the n−1 bit being a logical low.

The equalizers 356 and 358 follow a similar process as was described above with respect to the equalizers 202 and 292. The outputs 366 and 369 may have resulted from the distortion correction process. The outputs 366 and 369 may be transmitted to the selection device 386, controlled by rising edge of the DQS signal 96. When received by the selection device 386, the outputs 366 and 369 may wait until the n−1 bit is successfully transmitted to the selection device 368 and stored for transmission along the path 78.

When enough time has passed for the n−1 bit to be transmitted to the selection device 368 through the path 78, the corrected bit 88 may be selected using the n−1 bit transmitted along the path 78. The corrected bit 88 may be transmitted to the deserializer 66 and stored for transmission to the selection device 294. Data stored in the deserializer 66 for transmission along the paths 74, 76, and 78 may be updated accordingly. The distortion correction circuit 350 may have processed two bits of data while performing the four bits precision of voltage correction. However, there may exist an embodiment of distortion correction circuit that uses four bit processing, as opposed to two bit processing, in addition to the four bits of precision of voltage correction, as discussed earlier. A distortion correction circuit 400 suited for this application may be shown in FIG. 15.

Figure 15:
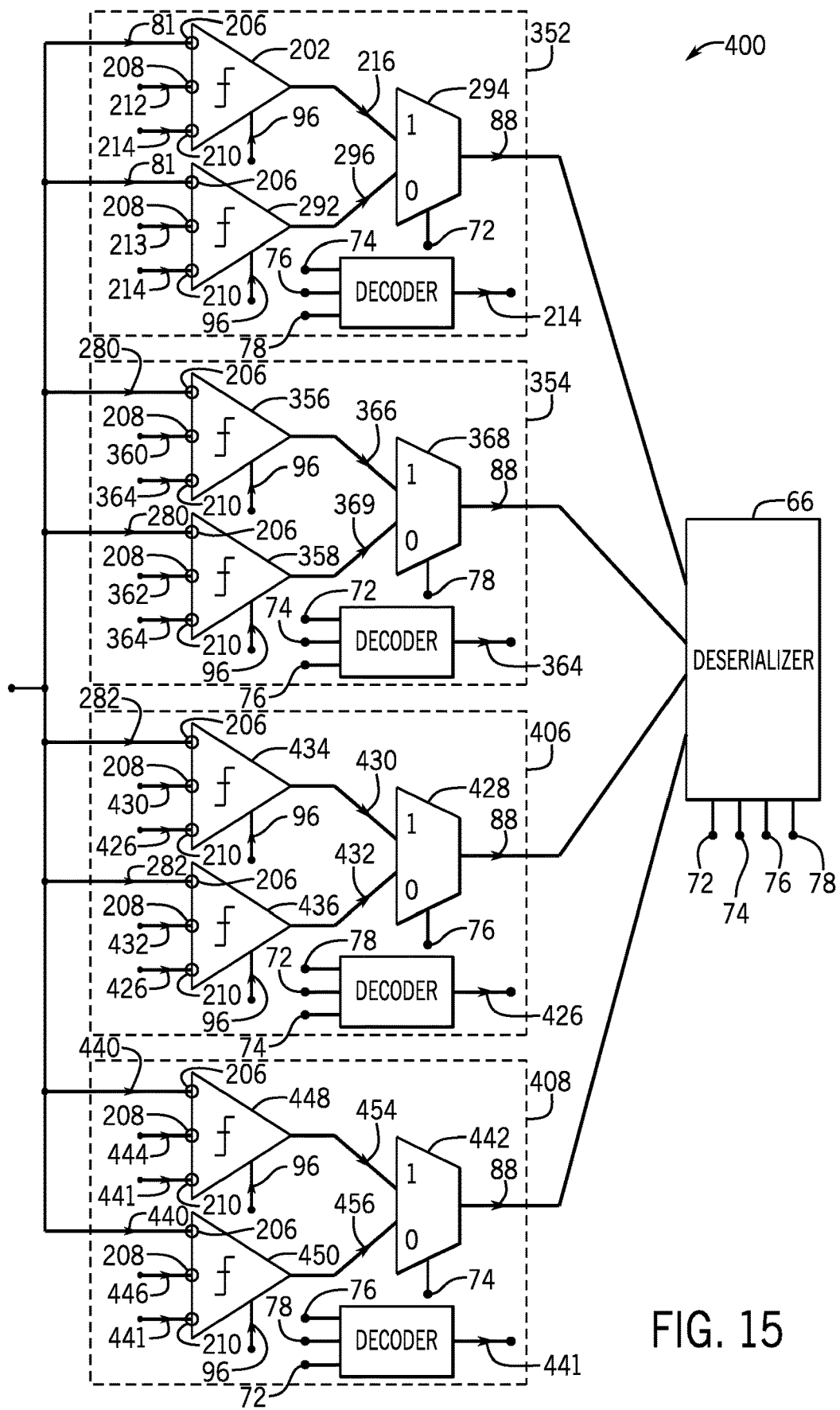
FIG. 15 illustrates a sixth embodiment of a distortion correction circuit, according to an embodiment of the present disclosure.

FIG. 15 illustrates the distortion correction circuit 400 which may be capable of processing four data bits at a four bit distortion correction level, and includes four duplications of the distortion correction circuit 290 with modification to the inputs between the duplications. The four duplications of the distortion correction circuit 290 may be illustrated with the first circuit 352, the second circuit 354, a third circuit 406, and a fourth circuit 408. In a similar manner as the distortion correction circuit 350, the method of rolling the distorted bit 81 received may be followed. As such, the distorted bit 81 may be received by the first circuit 352, the second distorted bit 280 may be received by the second circuit 354, the third distorted bit 282 may be received by the third circuit 406, a fourth distorted bit 440 may be received by the fourth circuit 408, and a fifth distorted bit may be rolled back to be received by the first circuit once the first iteration of the distortion correction is complete.

To elaborate further, the first circuit 352 may have received the distorted bit 81 and begun processing it using the method described with the distortion correction circuit 290, using the previous bit or weighted tap data transmitted along the paths 74, 76, and 78 to calculate the values necessary to supply the equalizers 202 and 292. The voltage correction signals 212 and 213 may have allowed the transmission of potentially different voltage correction values to the terminal 208 on the equalizers 202 and 292. Outputs 216 and 296 to the selection device 294 may be transmitted on the rising edge of the DQS signal 96. The selection device 294 may use the n−1 bit value stored in the deserializer 66 for transmission along path 72 to make the final decision on the corrected bit 88 value of the second distorted bit 280.

The inputs used for the final decision of the corrected bit 88 for the second circuit 354 may be different from the inputs for the first circuit 352. The second circuit 354 may have received the second distorted bit 280 and began processing it, after the distorted bit 81 is received. The method described with the distortion correction circuit 290 may be used to correct the distorted bit 280, except that the previous bit or weighted tap data transmitted along the paths 72, 74, and 76 may be used to calculate the values necessary to supply a decoded signal 364 to the equalizers 356 and 358. Potentially different voltage correction values to the terminal 208 may be transmitted by voltage correction signals 360 and 362 on equalizers 356 and 358. Outputs 366 and 369 to the selection device 368 may be transmitted on the rising edge of the DQS signal 96. The selection device 368 for the second circuit 354 may use the n−1 bit value stored in the deserializer 66 for transmission along path 78 to make the final decision on the corrected bit 88 value of the second distorted bit 280.

The inputs used for the final decision of the corrected bit 88 for the third circuit 406 may be different from the inputs for the second circuit 354. The third circuit 406 may have received the third distorted bit 282 and began processing it, after the second distorted bit 280 is received. The method described with the distortion correction circuit 290 may be used to correct the third distorted bit 282, except that the previous bit or weighted tap data transmitted along the paths 72, 74, and 78 may be used to calculate the values necessary to supply a decoded signal 426 to equalizers 434 and 436 at terminal 210. Potentially different voltage correction values to the terminal 208 may be transmitted by voltage correction signals 430 and 432 on equalizers 434 and 436. The voltage correction signals 430 and 432 output to a selection device 428 may be transmitted on the rising edge of the DQS signal 96. The selection device 428 for the third circuit 406 may use the n−1 bit stored in the deserializer 66 for transmission along the path 76 to make the final decision on the corrected bit 88 value of the third distorted bit 282.

The inputs used for the final decision of the corrected bit 88 for the fourth circuit 408 may be different from the inputs for the third circuit 406. The fourth circuit 408 may have received a fourth distorted bit 440 and began processing it, after the third distorted bit 282 is received. The method described with the distortion correction circuit 290 may be used to correct the fourth distorted bit 440, except that the previous bit or weighted tap data transmitted along the paths 72, 76, and 78 may be used to calculate the values necessary to supply a decoded signal 441 to equalizers 448 and 450. Potentially different voltage correction values to the terminal 208 may be transmitted by voltage correction signals 444 and 446 on equalizers 448 and 450. Outputs 454 and 456 to the selection device 442 may be transmitted on the rising edge of the DQS signal 96. The selection device 442 for the fourth circuit 408 may use the n−1 bit stored in the deserializer 66 for transmission along the path 74 value to make the final decision on the corrected bit 88 value of the fourth distorted bit 440.

The output from the selection devices 294, 368, 428, and 442 may be sent to the deserializer 66 at the conclusion of each final decision on the corrected bit 88. In the deserializer 66, the n−1 bit, the n−2 bit, the n−3 bit, and the n−4 bit may be used to update the data stored in the deserializer 66 for transmission along the paths 72-78 in accordance with the corrected bit 88 data (e.g., the corrected bit 88 from the first circuit 352 will be stored for transmission along the path 78, the corrected bit data from the second circuit 354 will be stored for transmission along the path 76, the corrected bit data from the third circuit 406 will be stored for transmission along the path 74, and the corrected bit data from the fourth circuit 408 will be stored for transmission along the path 72). It may be noted that the corrected bit 88 may not have completed transmission to the deserializer 66, nor updated values stored for transmission along the paths 72-78 prior to the reception of the fifth distorted bit, thus the method of delaying the final selection of the corrected bit 88 may be continued.

The voltage correction values transmitted to the equalizers in FIGS. 9-15 may be the outputs from a combinational circuit, hereinafter referred to as a voltage correction signal generator. Some embodiments may generate the voltage correction values in advance of performing the distortion correction process (e.g., during a start-up and/or an initialization operational mode of the memory device 10).

The voltage correction signal generator may operate to generate magnitudes and polarities for taps (e.g., voltages) due to each previous bit to collectively offset the distortion caused by those previously received bits. The tap may be a weighted tap that may be combined, through processing circuitry, with an initial reference value to generate an offset that corresponds to or mitigates the distortion of the received data (e.g., mitigates the distortion of distorted bit n). Thus, the voltage correction signal generator may generate a voltage correction value specific to each possible combination of data (e.g., possible binary combinations of logical high or logical low) that may be transmitted along the paths 72, 74, 76, and/or 78. As may be appreciated, the voltage correction signal generator may be capable of providing voltage correction values for more or less than four previous bits of data used in distortion correction, depending on the granularity of ISI bit distortion correction desired. For purposes of explanation, the exemplary embodiment may provide four bit granularity of ISI bit distortion correction.

Figure 16:
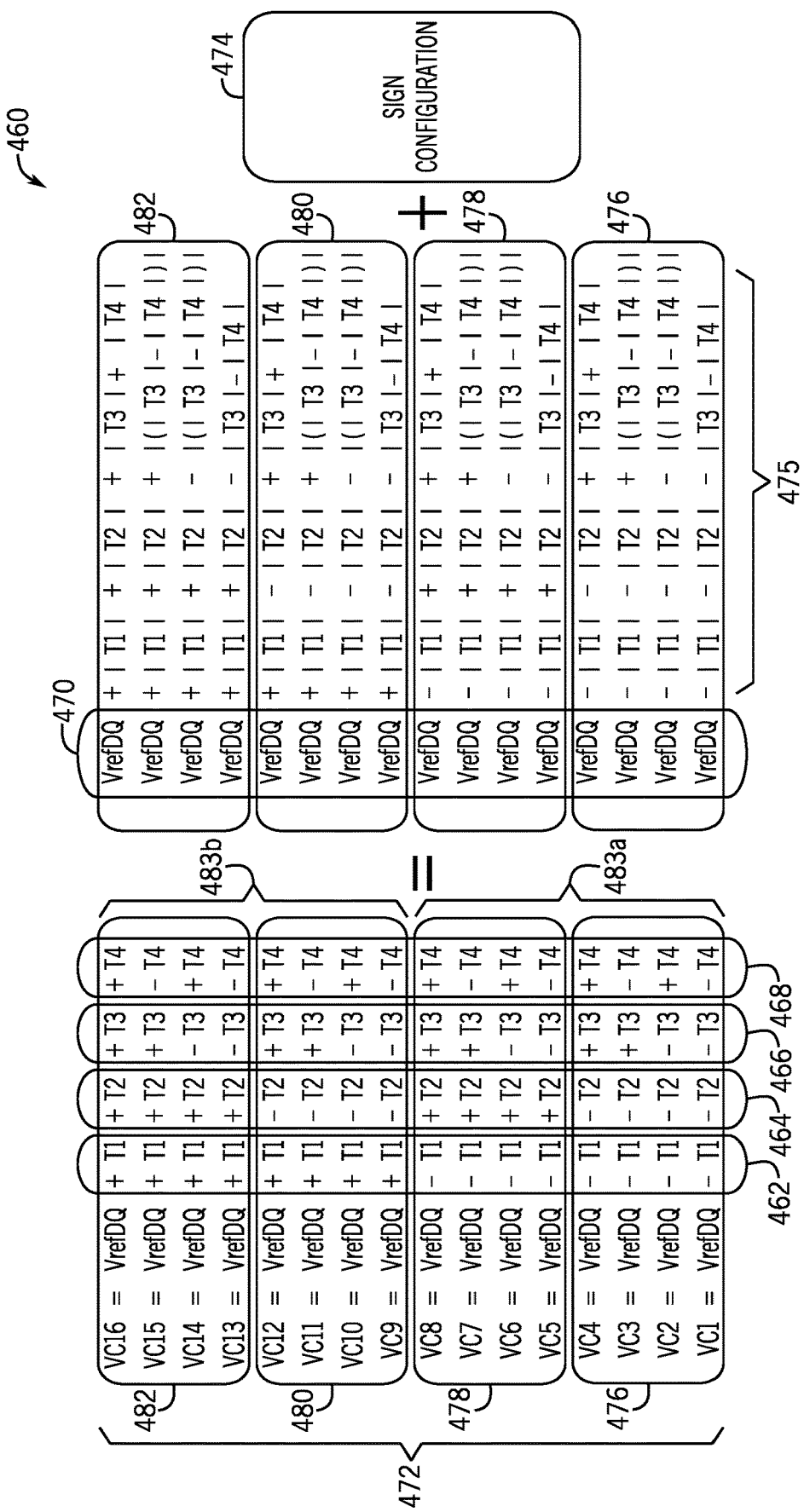
FIG. 16 illustrates a simplified diagram of a method for generating the voltage correction values of FIG. 15 using weighted tap absolute values and sign configuration, according to an embodiment of the present disclosure.

FIG. 16 illustrates a diagram 460 of the generation of the voltage correction signals 212 and 213 by the voltage correction signal generator. As FIG. 16 illustrates, the weighted taps 462-468 are used to define the sixteen different states of the previously described method to correct the distorted bit 81. The influence of each of the four previous bits of data may be represented through the sign of the weighted taps 462-468. In this way, the possibility of a logical high previous bit is illustrated as adding the weighted tap 462-468 (e.g., +T1, +T2, +T3, +T4) to an initial reference value 470 (e.g., the DQ reference signal 83) and the possibility of a logical low previous bit is illustrated as subtracting the weighted tap 462-468 (e.g., −T1, −T2, −T3, −T4) from the initial reference value 470. For each of the sixteen different states, as represented through the different combinations of adding and subtracting the weighted taps 462-468, the weighted tap 462-468 is combined with the initial reference value 470 to create the voltage correction signals 1 through 16 (VC1-VC16) 472.

However, the final polarity of VC1-VC16 472 may not account for the polarities of weighted taps 462-468 (e.g., negative polarity, positive polarity). Thus, a sign configuration 474 may be added to verify and to correct the final polarity of the VC1-VC16 472. In addition to the sign configuration 474, absolute weighted taps values 475 (e.g., unsigned weighted tap values) may be combined with the initial reference value 470, in the place of weighted taps 462-468. The absolute weighted taps values 475 represent the same sixteen different states as the weighted taps 462-468 (e.g., addition represents logical high and/or subtraction represents logical low contribution), however, the absolute weighted taps values 475 are the absolute values of weighted taps 462-468 and, accordingly, may not have a polarity. Through the sign configuration 474, the individual polarities of the weighted taps 462-468 may be considered and used to determine the VC1-VC16 472 by applying polarities of the weighted taps 462-468 to the absolute weighted taps values 475. It is noted that as signal outputs from the voltage correction signal generator, VC1-VC8 483a may be supplied as the voltage correction signals 213 and the VC9-VC16 483b may be supplied as the voltage correction signals 212.

In generating the VC1-VC16 472, the VC1-VC16 472 may be grouped to improve efficiency of generation and/or to decrease the circuitry used to perform the generation. Groups 476-482 may be made based on similarities between the states the group represents. For example, the group 476 may represent the binary states associated with the binary state framework 00XX (e.g., 0000, 0001, 0010, and 0011, as defined through the addition or subtraction of the absolute weighted taps values 475). Through grouping, the circuity used to represent the 00XX portion of the binary state may be shared to generate the four states, instead of having four separate circuits to generate the four binary states of group 476. As illustrated, the generation of VC1-VC4 subset of VC1-VC16 472 may be grouped in the group 476 that follows the binary state framework 00XX. Likewise, VC5-VC8 may be grouped in group 478 that follows the binary state framework 01XX, VC9-VC12 may be grouped in the group 480 that follows the binary state framework 10XX, and VC13-VC16 may be grouped in the group 482 that follows the binary state framework 11XX. In this way, the voltage correction signal generator may use a combination of individual circuits (e.g., circuits representing the binary state frameworks) and common circuits (e.g., circuits representing the binary combinations of the absolute weighted tap values for the n−3 and n−4 bits) to generate the VC1-VC16 472.

Figure 17:
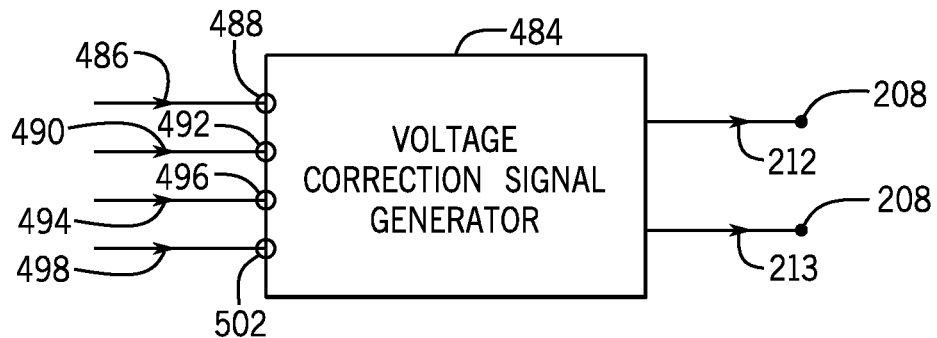
FIG. 17 illustrates a simplified block diagram of a voltage correction signal generator to perform the illustrated method of FIG. 16, according to an embodiment of the present disclosure.

FIG. 17 illustrates an embodiment of a voltage correction signal generator 484. As illustrated, the voltage correction signal generator 484 generates the voltage correction signals 212 and 213. The voltage correction signal generator 484 may generate the voltage correction signals 212 and 213 based at least on the minimum voltage correction (Vmin) signal transmitted on a path 486 (e.g., initial reference value 470) at terminal 488. The Vmin signal on the path 486 may represent a baseline, or reference, voltage upon which to add to the influence of the previous bits (e.g., a minimum value to use in offsetting an inter-symbol interference from a data stream on a distorted bit). The Vmin signal on the path 486 may be a voltage that represents the minimum voltage correction signal that may be output from the voltage correction signal generator 484 (e.g., 0000). Additionally or alternatively, the Vmin signal on the path 486 may be two signals, where the first signal represents the minimum voltage correction signal (e.g., 0000) and the second signal represents the minimum voltage correction signal with the n−1 bit absolute weighted taps value assumed to be high (e.g., 1000).

The voltage correction signal generator 484 may also use a driving input transmitted on path 490 at terminal 492 and a driving input transmitted on path 494 at terminal 496 to generate the voltage correction signals 212 and 213. The driving inputs on the paths 490 and 494 may be used by the voltage correction signal generator 484 to drive circuitry internal to the voltage correction signal generator 484 to generate the voltage correction signals 212 and 213. As such, the driving inputs on the paths 490 and 494 may be inputs (e.g., voltages, currents) with designed values to drive the circuitry to generate desired voltage correction signals 212 and 213.

Finally, the voltage correction signal generator 484 may also use a tap bits input transmitted on path 498 in generating the voltage correction signals 212 and 213. The tap bits input on the path 498 may be transmitted at terminal 502 as an individual value for each of the four previous bits to individually weigh the influence of each of the four previous bits to create the voltage correction signals 212 and 213. In other words, the tap bits input on the path 498 may be used by the voltage correction signal generator 484 to define the unsigned weighted tap values and the polarities for the weighted tap values for use in generating the voltage correction signals 212 and 213, where the unsigned value of the weighted tap values may be equivalent to a magnitude of the weighted tap value or an absolute value of the weighted tap value (e.g., as in without a negative or positive sign assignment to the value) The tap bits input on the path 498 may be transmitted to the voltage correction signal generator 484 as signals indicative of the unsigned values and polarities of the weighted taps. In this way, the tap bits input on the path 498 may be transmitted as one or more signals for each of the four previous bits and/or as one signal indicative for the four previous bits used in cancelling the ISI distortion. The driving inputs on the paths 490 and 494, the Vmin signal on the path 486, and the tap bits input on the path 498 may be transmitted to one or more local generators of the voltage correction signal generator 484.

Figure 18:
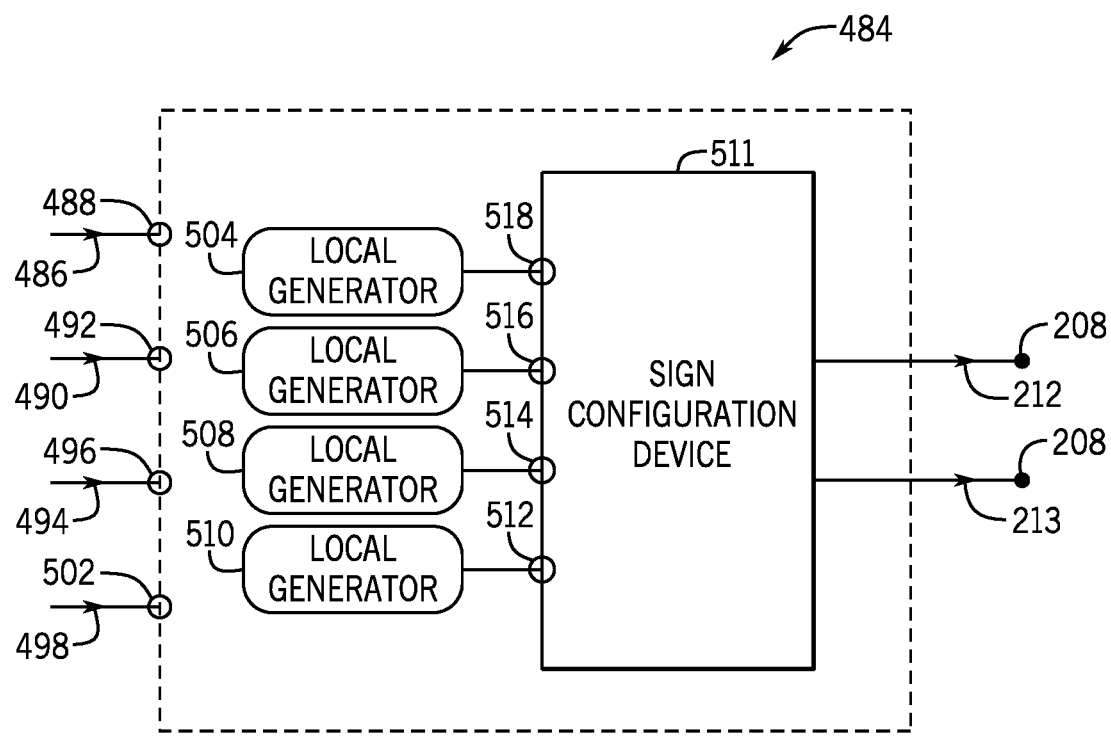
FIG. 18 illustrates an embodiment of the voltage correction signal generator of FIG. 17, according to an embodiment of the present disclosure.

FIG. 18 illustrates a block diagram of the voltage correction signal generator 484. As illustrated, the voltage correction signal generator 484 includes local generators 504-510. The output from each of the local generators 504-510 may correspond to the groups 476-482. In this way, the local generator 504 may transmit signals corresponding to group 482 at a terminal 518, the local generator 506 may transmit signals corresponding to group 480 at a terminal 516, the local generator 508 may transmit signals corresponding to group 478 at a terminal 514, and the local generator 510 may transmit signals corresponding to group 476 at a terminal 512. The local generators 504-510 may transmit signals corresponding to the groups 476-482 through conductive paths to the terminals 512-518 of the sign configuration device 511. It may be appreciated that each of the conductive paths to the terminals 512-518 may represent one or more conductive paths. For example, in an embodiment, the conductive path to the terminal 512 may use one conductive path to transmit the signals corresponding to the group 476. However, in a second embodiment, the conductive path to the terminal 512 may use four conductive paths to transmit the signals corresponding to the group 476.

The signals corresponding to the groups 476-482 transmitted by the local generators 504-510 on conductive paths to the terminals 512-518 to the sign configuration device 511 may be indicative of voltage correction value unsigned values determined from the weighted tap values. The signals corresponding to the group 482 may include the voltage correction values for VC13-VC16 (e.g., 1111, 1110, 1101, 1100), the signals corresponding to the group 480 may include the unsigned voltage correction values for VC9-VC12 (e.g., 1000, 1001, 1010, 1011), the signals corresponding to the group 478 may include the unsigned voltage correction value for VC5-VC8 (e.g., 0100, 0101, 0110, 0111), and the signals corresponding to the group 476 may include the unsigned voltage correction value for VC1-VC4 (e.g., 0000, 0001, 0010, 0011). The sign configuration device 511 may include circuitry and/or processing methods to verify, consider and/or to correct the final polarity of the voltage correction signals 212 and 213 from the voltage correction values transmitted at the terminals 512-518.

The sign configuration device 511 may be configured to process the signals corresponding to the groups 476-482 transmitted at the terminals 512-518 based at least upon the tap bits input on the path 498 defining the polarities for the weighted tap values. Through processing, the sign configuration device 511 may assign a desired polarity to the voltage correction value unsigned values that corresponds to the polarities of the weighted tap values. From the sign configuration device 511, the voltage correction signal generator 484 may transmit the voltages to be used in distortion correction with unsigned values and polarities as the voltage correction signals 212 and 213. For example, the voltage correction signals 212 and 213 may transmit to the terminal 208 on the equalizers 202 and 292. In this way, the voltage correction signals 212 and 213 may be used in cancelling the ISI distortion from the previous bits in the data stream.

Figure 19:
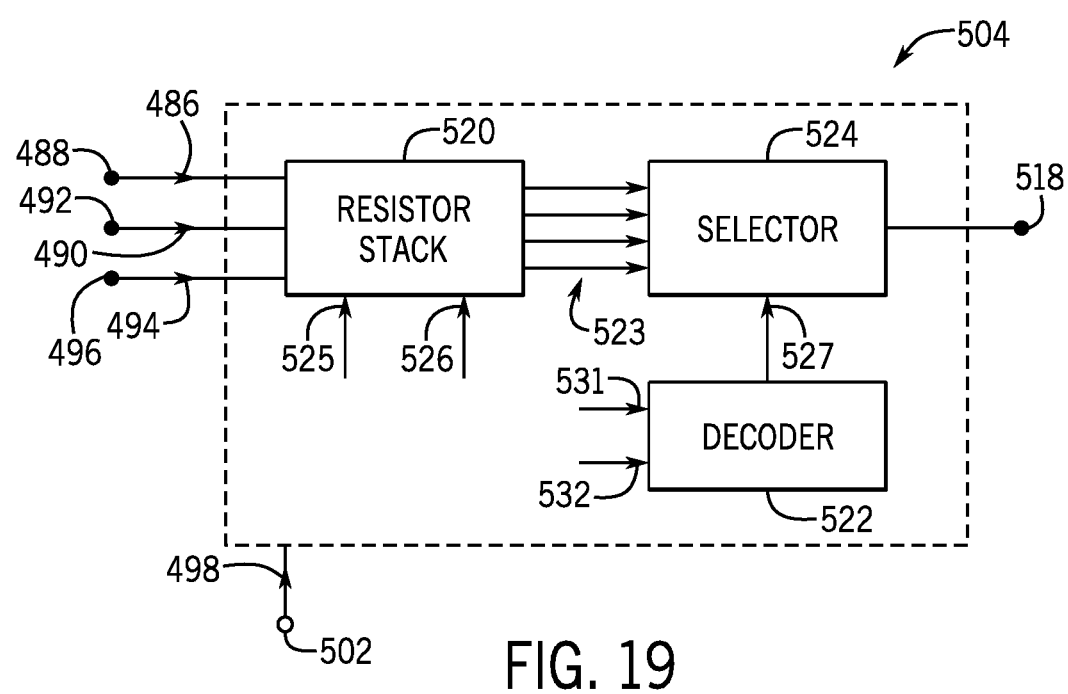
FIG. 19 illustrates a block diagram of a local generator of FIG. 18, according to an embodiment of the present disclosure.

As described earlier, there may be commonalities between the groups 476-482 in the calculation process for the individual VC1-VC16 472 of the voltage correction signals 212 and 213. Thus, between the local generators 504-510 there may be circuitry which is common to, or shared between, the local generators 504-510 and there may be circuitry which is unique to one of the four local generators 504-510. To elaborate, a detailed view of the local generator 504 is illustrated in FIG. 19. However, it should be noted that the illustrated elements of the local generator 504 of FIG. 19 may similarly be present in local generators 506-510.

FIG. 19 illustrates a block diagram of the local generator 504 that includes a resistor stack 520, a decoder 522, and unsigned values of the voltage correction signals (e.g., a plurality of unsigned bit distortion correction values) transmitted on path 523 to a selector 524. As illustrated, the resistor stack 520 receives the driving inputs on the paths 490 and 494, the Vmin signal on the path 486, and an n−1 tap bit input transmitted on path 525 and an n−2 tap bit input transmitted on path 526. The tap bits input on the path 498 may be processed into individual signals (e.g., the n−1 tap bit input on the path 525, the n−2 tap bit input on the path 526) that each represent one of the weighted tap values for one of the n−1, n−2, n−3, and/or n−4 bits. The local generator 504 may transmit the n−1 tap bit input on the path 525 and the n−2 tap bit input on the path 526. Path 525 and path 526 transmit unsigned weighted tap signals for n−1 tap bit input and n−2 tap bit input. The local generator 504 may transmit the n−1 tap bit input on the path 525 and the n−2 tap bit input on the path 526 to the resistor stack 520. The n−1 tap bit input on the path 525 and the n−2 tap bit input on the path 526 may vary the resistance of the resistor stack 520, as will be elaborated upon with discussion accompanying FIG. 20 and FIG. 21. Through varying the resistance of the resistor stack 520, the desired weighted tap value for the n−1 bit and/or the n−2 bit may be able to be set.

From setting the desired weighted tap values for the n−1 bit and/or the n−2 bit, the binary state framework for the local generator 504 may be established. The resistor stack 520 may transmit the unsigned values of the voltage correction signals on the path 523 to the selector 524. The unsigned values of the voltage correction signals on the path 523 may correspond to all possible variations, or value steps, for the unsigned values of the n−3 bit weighted tap value and the n−4 bit weighted tap value within the binary state framework. The resistor stack 520 may use individual resistors to step, or vary, the value of the unsigned value of the absolute weight tap values, as will be described in the discussion accompanying FIG. 20 and FIG. 21. The selector 524 may select the unsigned values of the voltage correction signals on the path 523 corresponding to each of the four possible states based on signals transmitted on path 527 from the decoder 522 (e.g., the path 523 transmits all possible variations for 11XX such that the selector may select the specific voltage correction signals unsigned values for 1100, 1101, 1110, and 1111, where the values for XX00, XX01, XX10, and XX11 are determined by the decoder 522 and transmitted to the selector 524 on the path 527).

The decoder 522 may generate the signals on the path 527 based on an n−3 tap bit input transmitted on path 531 and an n−4 tap bit input transmitted on path 532. The path 531 and the path 523 transmit unsigned weighted tap signals for the n−3 and n−4 tap bit input. The decoder 522 may receive the n−3 tap bit input on the path 531 and the n−4 tap bit input on the path 532 derived from the tap bits input on the path 498. Logic circuitry of the decoder 522 may process the n−3 tap bit input on the path 531 and the n−4 tap bit input on the path 532 to generate the signals on the path 527 that are indicative of the value steps for unsigned values of the n−3 bit and n−4 bit weighted tap values. The decoder 522 transmit the signals on the path 527 to the selector 524. For example, the decoder 522 may receive indication that an unsigned value of A be used in correcting the n−3 bit distortion and that an unsigned value of Y be used in correcting the n−4 bit distortion. Thus, the decoder 522 may transmit to the selector 524 that the XX00 value step is worth (XX−A−Y), the XX01 is worth (XX−A+Y), the XX10 is worth (XX+A−Y) and the XX11 is worth (XX+A+Y), where XX may represent all the possible combinations of the voltage correction signals unsigned values transmitted to the selector 524 from the resistor stack and where all the possible combinations include not only A and Y absolute weight tap values but also all other possible weight tap value combinations corresponding to that specific binary state framework (e.g., 00XX, 01XX, 10XX, 11XX) of the local generators 504-510, as will be described. The selector 524 ultimately choses which sixteen voltage correction signals unsigned values from all possible voltage correction signals unsigned values correspond to the actual n−3 bit weighted tap value and n−4 bit weighted tap values (XX−A−Y), (XX−A+Y), (XX+A−Y), (XX+A+Y), The selector 524 may select unsigned values of the voltage correction signals corresponding to binary framework of the group 482 based at least on the signals from the path 527 (e.g., selection signal). The selector 524 may select the unsigned values on the path 523 specific to the binary combinations of the group 482 but using the weighted tap values of the n−3 bit and the n−4 bit.

Similar to how the resistance of the resistor stack 520 may vary to create the desired weighted tap values for the n−1 and n−2 bits, the resistance of the resistor stack 520 may vary between local generators 504-510 to create the unsigned values of the voltage correction values on the path 523 representative of the four different binary state frameworks. Thus, through varying the resistance of the resistor stack 520, each of the local generators 504-510 may be operated to establish different binary state frameworks, where the combination of the four local generators may generate the sixteen voltage correction signals, as described earlier.

The binary state frameworks of the local generators 504-510 may be defined as 00XX, 01XX, 10XX, and 11XX for the four bit granularity case, where XX represents the binary combinations for the n−3 bit and the n−4 bit (e.g., XX=00, 10, 01, 11). When represented in this way, each binary state framework may be created through different versions of the resistor stack 520 between the local generators 504-510. The different versions of the resistor stack 520 may couple to a similar selector 524 in the circuit design of the selector 524 (e.g., same circuit for each local generators 504-510 for a total of four selector 524 circuits for the four local generators 504-510 in the four-bit correction example), where each selector 524 may couple to a common decoder 522 (e.g., one decoder 522 circuit for the four selector 524 circuits). As such, each of the local generators 504-510 may include one version of the resistor stack 520, one of the selector 524, and share a common circuit for the decoder 522. Thus, the resistor stack 520 may be used to establish the binary state framework (e.g., 00XX, 01XX, 10XX, 11XX) and the combination of the selector 524 and the decoder 522 may be used to establish the four possible binary combinations (e.g., XX00, XX01, XX10, XX11) that share the n−1 bit and the n−2 bit binary combination defined by the binary state framework.

Thus, through the varying the resistor stack 520, each of the local generators 504-510 may correspond to one of the binary state frameworks. For example and as illustrated, the local generator 504 corresponds to 11XX (e.g., 11XX derived from group 482), the local generator 506 corresponds to 10XX (e.g., 10XX derived from group 480), the local generator 508 corresponds to 01XX (e.g., 01XX derived from group 478), and the local generator 510 corresponds to 00XX (e.g., 00XX derived from group 476). Thus, the sixteen total possible states of the four previous bits may be accounted for in generating the VC1-VC16 for use in voltage correction signals 212 and 213.

In a similar manner, the voltage correction signals unsigned values for the four local generators 504-510 corresponding to the groups 476-482 may be transmitted by the local generators 504-510 at the terminals 512-518. As explained, generating the unsigned values of the voltage correction signals on the path 523 used in determining the VC1-VC16 472 may depend in part upon varying the structure of the resistor stack 520 between the local generators 504-510 to create the different binary state frameworks.

Figure 20:
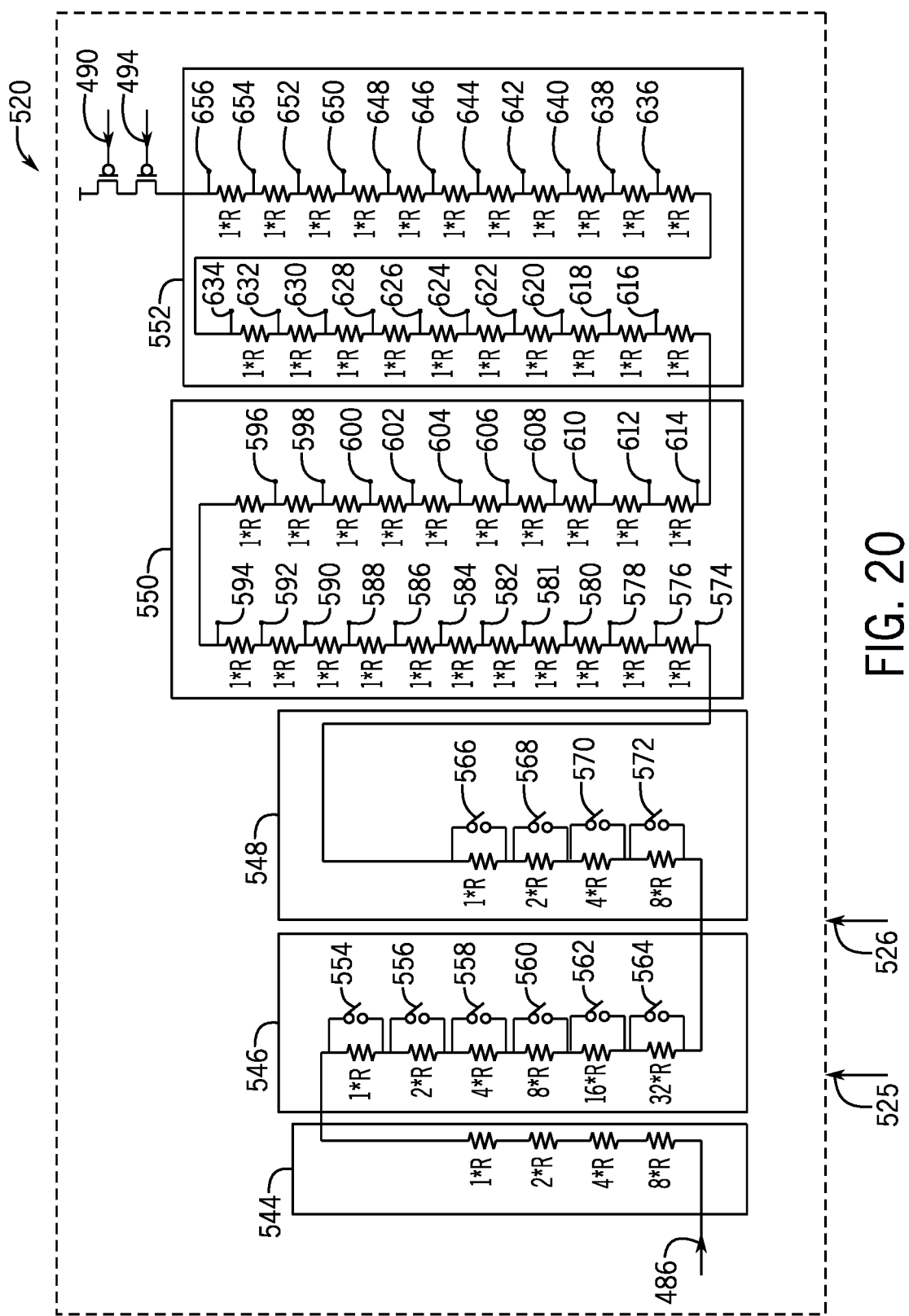
FIG. 20 illustrates a circuit diagram of the resistor stack of the local generator of FIG. 19, according to an embodiment of the present disclosure.

FIG. 20 illustrates the structure of the resistor stack 520 for the local generator 504 including the Vmin input on the path 486, the driving inputs on the paths 490 and 494, and one or more resistor groups 544-552 of individual resistors. The driving inputs on the paths 490 and 494 may be transmitted through the resistor stack 520 creating voltages across individual resistors of the resistor groups 544-552. The voltages across the individual resistors may be combined with the Vmin input on the path 486 and transmitted to the selector 524 at terminals 574-636. As such, changes to the resistor groups 544-552 that change resistance of the resistor stack 520 may change the voltages transmitted at the terminals 574-636. Through the changes, the resistor groups 544-548 may be operated to alter the unsigned values of the voltage correction signals on the path 523 at the terminals 574-636.

The unsigned values of the voltage correction signals on the path 523 may represent all possible contributions to the voltage correction signals from the weighted tap values for the n−3 bit and the n−4 bit. In other words, the unsigned values of the voltage correction signals on the path 523 may include the effects of the weighted tap values for the n−1 and n−2 bits based on the binary state framework. The unsigned values of the voltage correction signals on the path 523 may include all possible options of effects of the weighted tap values for the n−3 and n−4 bits for future selection of the actual effects of the weighted tap values for the n−3 and n−4 bits, as described with the discussion of FIG. 19.

The resistor stack 520, through leveraging the voltages across the individual resistors of the resistor groups 550-552, may generate the unsigned values of the voltage correction signals on the path 523 transmitted at terminals 574-656. The voltages across the individual resistors of the resistor groups 550-552 may be added to the Vmin input on the path 486 and the voltages of the individual resistors of the resistor groups 544-548. Each of the individual terminals 574-656 may transmit a possible unsigned value of the voltage correction signal (e.g., each individual terminal 574-656 represents the different value steps). The individual terminals 574-656 may represent voltages for the four binary combinations using all possible weighted tap values for the n−3 and n−4 bits. It is noted that in this embodiment the selector 524 and the decoder 522 may determine the binary combinations for the unsigned weighted tap values for the n−3 and n−4 bits through selecting four values from all of the possible contributions transmitted through the unsigned values of the voltage correction signals on the path 523. The four values selected with the selector 524 may be the binary combinations of the binary state framework (e.g., 11XX), with an unaccounted for effect of the unsigned weighted tap value for the n−3 and n−4 bits.

The unsigned weighted tap value for the n−1 bit and the n−2 bit, as well as the binary state framework, may be established through the resistor groups 544-548. The resistor groups 544 and 548 may represent the unsigned weighted tap value for the n−2 bit and the resistor group 546 may represent the unsigned weighted tap value for the n−1 bit. The unsigned weighted tap values for the n−1 and n−2 bits may be changed through changes made to the resistor groups 544-548. Switchable elements 554-572 may be operated to generate the unsigned weighted tap values for the n−1 and n−2 bits based on the n−1 tap bit input on the path 525 and/or the n−2 tap bit input on the path 526.

The opening and/or closing of the switchable elements 554-572 based on the n−1 tap bit input on the path 525 and/or the n−2 tap bit input on the path 526 may vary the resistance value of the resistor groups 546-548. For example, the resistance value for the resistor group 546 may increase if one or more switchable elements 554-564 are operated to open and may decrease if the one or more of switchable elements 554-564 are operated to close. Control over the unsigned weighted tap values may result through operating the switchable elements 554-572 to open or close. For example, if the switchable element 554 is operated to close, current through the circuit may bypass the resistor (e.g., 1*R resistor), thus reducing the voltage across the resistor and decreasing the overall unsigned weighted tap values for the n−1 bit since the overall unsigned weighted tap values for the n−1 that receives the voltage contribution from the voltage across the resistor.

Additionally or alternatively, binary state framework for the local generator 504 may be changed through changes made to the resistor groups 544-548. Operating the switchable elements 554-572 to open and/or close may change the represented binary state framework of local generator 504. Through the opening and closing of the switchable elements 554-572, a logical high and/or logical low state of the n−1 bit and/or the n−2 bit may be created. For example, the resistor group 546 may define the unsigned weighted tap value for the logical high n−1 bit by opening switchable element 572 and closing elements 566-570 but a logical low n−1 bit may be represented by closing switchable elements 566-572. As such, the switchable elements 554-572 may be operated to change the unsigned weighted tap value as well as whether a logical high or a logical low is represented in the binary state framework for the n−1 bit and/or the n−2 bit.

Figure 21:
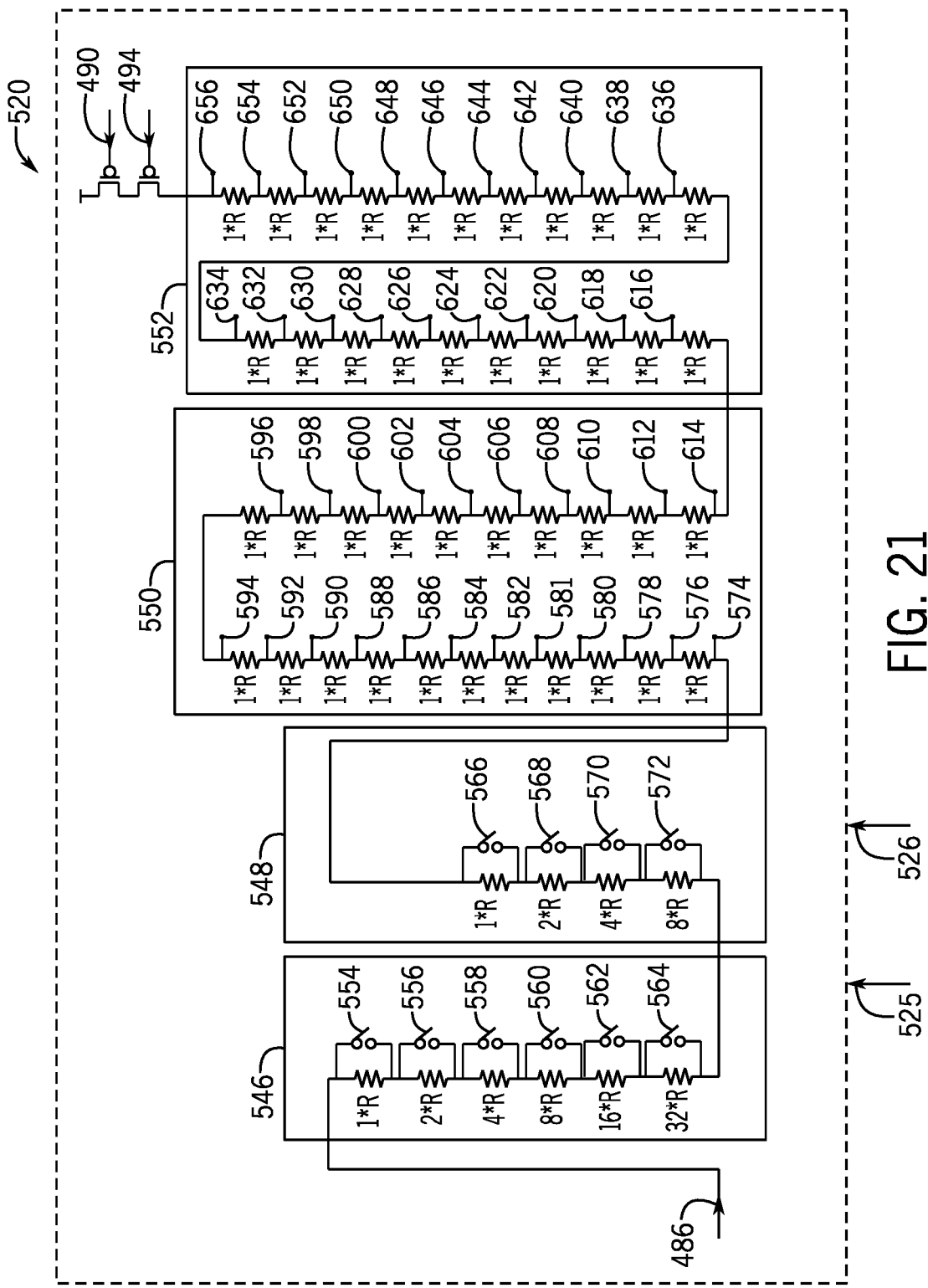
FIG. 21 illustrates a circuit diagram of the resistor stack of the local generator of FIG. 19, according to an embodiment of the present disclosure.

Additionally or alternatively, binary state framework for the local generator 504 may be changed through different changes made to the resistor groups 544-548. The binary state framework may be changed through excluding or including the resistor groups 544-548. Additionally or alternatively, the binary state framework may be changed through inverting the n−1 tap bit input on the path 525 and/or the n−2 tap bit input on the path 526 to the switchable elements 554-572 or through receiving a second voltage as the Vmin input on the path 486. Between the local generators 504-510, the resistor stacks 520 may have different structures to create a different binary state framework. FIG. 21 illustrates an example of a different structure for the resistor stack 520 for the local generator 506 to create a different binary state framework (e.g., 10XX).

As illustrated in FIG. 21, the resistor stack 520 of local generator 506 may include the resistor groups 546-552, the Vmin input on the path 486, the driving signals on the paths 490 and 494, and switchable elements 554-572. The different binary state frameworks may be represented through the combinations of excluded or included elements and through the values of the Vmin input on the path 486. To elaborate, the Vmin input on the path 486 may be the same initial reference value for all the local generators 504-510, and/or the Vmin input on the path 486 may vary between local generators 504-510 to vary the amount of circuitry used to establish the binary state framework. As illustrated, the resistor group 548 may represent the n−2 bit unsigned weighted tap value. The resistor group 546 may be excluded to indicate that the n−2 bit is a logical low, as represented by the binary state framework of local generator 506 (e.g., 10XX). The switchable elements 566-572 of the resistor stack 520 may receive and respond to the n−1 tap bit input on the path 525 and the n−2 tap bit input on the path 526, as described earlier. In some embodiments, the n−1 tap bit input on the path 525 and the n−2 tap bit input on the path 526 may be inverted to represent the binary state framework of local generators 504-510.

Generally, as illustrated through FIG. 20 and FIG. 21, the resistor stacks 520 of the local generators 504-510 may operate by receiving the n−1 tap bit input on the path 525 and the n−2 tap bit input on the path 526 to indicate the operation of the switchable elements 554-572 to indicate the desired unsigned weighted tap values for the n−1 and n−2 bits. More specifically, the switchable elements 554-572 may be operated to open and/or close in response to the n−1 tap bit input on the path 525 and/or the n−2 tap bit input on the path 526. The switchable elements 554-572 may be operated to represent all four binary state frameworks provided through the n−1 bit and the n−2 bit (e.g., binary state framework for local generator 510 is 00XX, binary state framework for local generator 508 is 01XX, binary framework for local generator 506 is 10XX, binary state framework for local generator 504 is 11XX). The resistor stacks 520 of each of the local generators 504-510 may couple to the selector 524 of each of the local generators 504-510 to provide one or more voltages at the terminals 574-656 that correspond to the various combinations of the unsigned values of the voltage correction signals on the path 523 of the binary state framework for each of the local generators 504-510.

In each of the local generators 504-510, the selector 524 may determine the four voltage correction signal unsigned values from the group of the unsigned values of the voltage correction signals on the path 523. The unsigned values of the voltage correction signals 523 may be based at least on the unsigned weighted tap values for the n−3 and n−4 bits, the binary sequences of the groups 476-482, and the binary state framework of the local generator 504, 506, 508, or 510. The selection device 524 may determine the four unsigned values of the voltage correction signals based in part on the signals on the path 527 and generated by the decoder 522.

Figure 22:
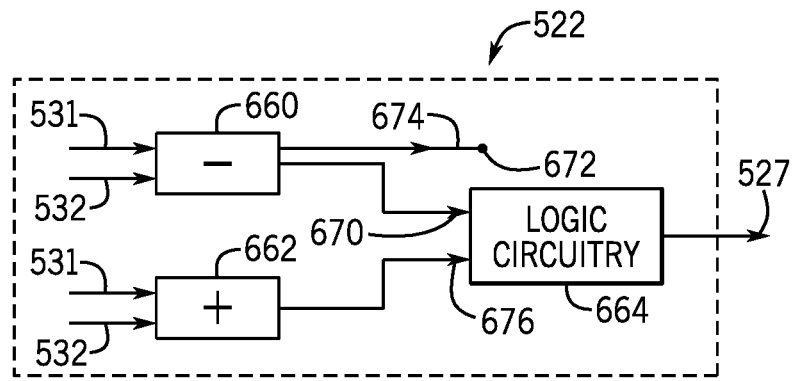
FIG. 22 illustrates a block diagram of the decoder of the local generator of FIG. 19, according to an embodiment of the present disclosure.

To describe further the generation of the signals on the path 527, FIG. 22 illustrates the decoder 522 generating the signals on the path 527 for use by the selection device 524. The decoder 522 may include a subtracter 660, an adder 662, and logic circuitry 664. As described earlier, the decoder 522 may receive the n−3 tap bit input on the path 531 and the n−4 tap bit input on the path 532, derived from the tap bits input on the path 498. The subtracter 660 and the adder 662 may receive the n−3 tap bit input on the path 531 and the n−4 tap bit input on the path 532.

The subtracter 660 may subtract the unsigned weighted tap values indicated through the n−3 tap bit input on the path 531 and the n−4 tap bit input on the path 532. In this way, the subtracter 660 may find the difference of the n−3 bit unsigned weighted tap value and the n−4 bit unsigned weighted tap value. The difference may be transmitted on a path 670 to the logic circuitry 664. The logic circuitry 664 may be operated to determine the voltage correction values for XX10 and XX01 based on the difference on the path 670. Indications of the unsigned weighted tap values may be transmitted to the selector 524 via signals on the path 527. The subtracter 660 may transmit a sign bit on path 674 indicative of if the n−3 tap bit input on the path 531 is smaller than the n−4 tap bit input on the path 532 at terminal 672. The sign bit on the path 674 may be used in the sign configuration device 511.

Similarly, the adder 662 may add the values indicated through the n−3 tap bit input on the path 531 and the n−4 tap bit input on the path 532. In this way, the adder 662 may be operated to find the sum of the n−3 bit unsigned weighted tap value and the n−4 bit unsigned weighted tap value. The sum may be transmitted on path 676 to the logic circuitry 664. The logic circuitry 664 may determine the n−3 bit unsigned weighted tap value and the n−4 unsigned weighted tap value for XX11 and XX00 based on the sum on the path 676. Indications of the unsigned weighted tap values may be transmitted by the decoder 522 to the selector 524 via signals on the path 527.

In this way, the logic circuitry 664 of the decoder 522 may process the n−3 tap bit input on the path 531 and the n−4 tap bit input on the path 532 to generate the signals on the path 527 indicative of the value step for the unsigned weighted tap values to offset distortion from the n−3 bit and the n−4 bit. As described, the decoder 522 may transmit signals on the path 527 to the selector 524 in each of the local generators 504-510. It is noted that while described as a single path, the path 527 may include one or more conductive paths to transmit the signals as desired in the embodiment.

Figure 23:
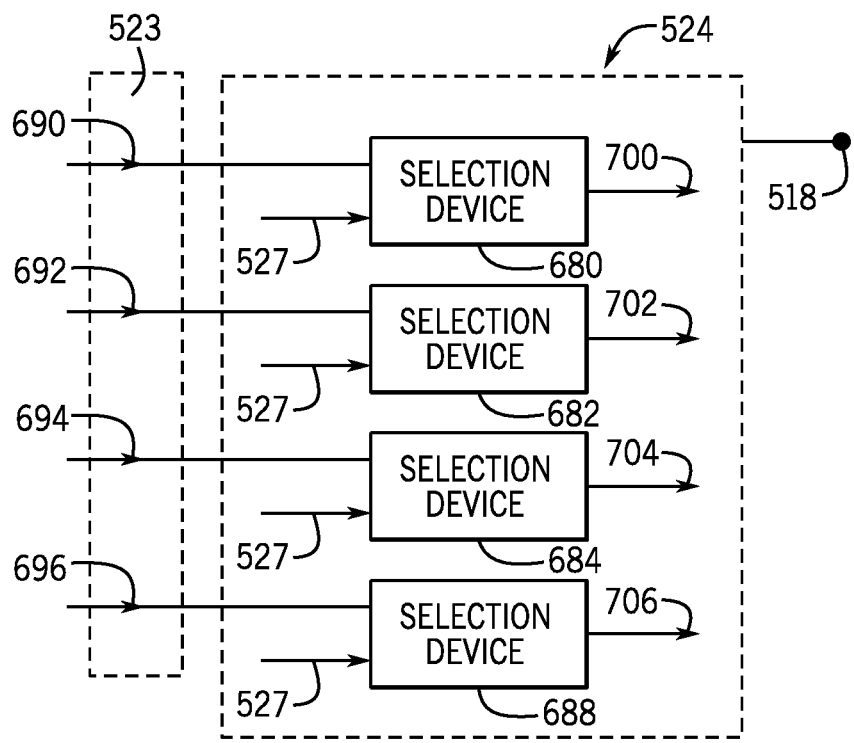
FIG. 23 illustrates a block diagram of the selection devices of the local generator of FIG. 19, according to an embodiment of the present disclosure.

FIG. 23 illustrates the selector 524 receiving the signals on the path 527 and the unsigned values of the voltage correction signals on the path 523, where specific voltage ranges of the unsigned values are transmitted on paths 690-696. The selector 524 of each of the local generators 504-510 may select the n−3 bit unsigned weighted tap values and the n−4 bit unsigned weighted tap values from all possible voltage correction signal unsigned values on the path 523 based on the signals on the path 527. As illustrated, the selector 524 includes the selection devices 680-688. Each selection device 680-688 may receive a subset of the unsigned values of the voltage correction signal from the specific voltage ranges on the paths 690-696 and the signals on the path 527. Based upon the combination received by the selection devices 680-688 of the specific voltage ranges on the paths 690-696 and the signals on the path 527, the selection devices 680-688 may select the unsigned values of the voltage correction signal to transmit on the paths 700-706 for binary states corresponding to the binary state framework for the local generator 504, 506, 508, or 510 and corresponding to the unsigned weighted tap values for the n−3 and n−4 bits. The final selected unsigned values of the voltage correction signal on the paths 700-706 may correspond to the binary states represented by the group 476-482 of the local generators 504-510.

For example, the selection devices 680-688 included in the local generator 504 may select the unsigned values of the voltage correction signals on the paths 700-706 for the binary states 11XX because the local generator 504 may establish the binary state framework 11XX. The selector 524 may subsequently select the unsigned values of the voltage correction signals on the paths 700-706 for each of the binary states 1100, 1101, 1110, and 1111, based on the signals transmitted on the path 527 indicating the unsigned weighted tap values of the n−3 and n−4 bits.

For each of the local generators 504-510, the selection device 680 receives a voltage range on the path 690 and the signals on the path 527. The path 690 may transmit the voltages or indications of the voltages from terminals 614 to terminals 656 from the resistor stack 520 to the selection device 680. The voltage range on the path 690 paired with the unsigned weighted tap values transmitted via the signals on the path 527, may lead the selection device 680 to operate to select a voltage correction signal unsigned value on the path 700 for the binary state XX11, where XX corresponds to the binary state framework of each of the local generators 504-510.

Similarly, the selection device 682 may receive a voltage range on the path 692 and the signals on the path 527. The path 692 may transmit the voltages, or indications of the voltages, from terminals 614 to terminals 644 from the resistor stack 520 to the selection device 682. The voltage range on the path 692, when paired with the unsigned weighted tap values transmitted via the signals on the path 527, may lead the selection device 682 to operate to select the voltage correction signal unsigned value on the path 702 for the binary state XX10. In this way, the contribution difference between the voltage correction signal unsigned values on the paths 700 and 702 between the n−4 bit being a logical high and the n−4 bit being a logical low is found in the difference in voltages between the terminals 644 and 656. The difference in voltages between the terminals 644 and 656 may vary as indicated through the unsigned weighted tap value transmitted via the signals on the path 527.

In this manner described, the additional selection devices 684 and 688 may receive voltage ranges and signals on the path 527 to select the voltage correction signal unsigned value on the paths 704 and 706 for the associated binary states. The selection device 684 receives a voltage range on the path 694 and the signals on the path 527. The path 694 may transmit the voltages, or indications of the voltages, from terminals 574 to terminals 614 from the resistor stack 520 to the selection device 684. The voltage range on the path 694 paired with the signals on the path 527 may lead to the selection device 684 selecting a voltage correction signal unsigned value on the path 704 for the binary state XX00. The selection device 688 may also receive a voltage range on the path 696 and the signals on the path 527. The path 696 may transmit the voltages, or indications of the voltages, from terminals 584 to terminals 614 from the resistor stack 520 to the selection device 688. The voltage range on the path 696 paired with the signals on the path 527 may lead to the selection device 688 selecting a voltage correction signal unsigned value on the path 706 for the binary state XX01.

As illustrated, the voltage correction signal unsigned values on the paths 700-706 of the local generator 504, representing the group 482, may be transmitted to the sign configuration device 511 at terminal 518. In a similar manner, the voltage correction signal unsigned values 700-706 for the local generators 506-510 may be transmitted at terminals 512-516 and may represent the groups 476-480, as depicted and described earlier with FIG. 16 and FIG. 18. Referring back to FIG. 18, the sign configuration device 511 may receive the voltage correction signal unsigned values on the paths 700-706 transmitted from the local generators 504-510. The sign configuration device 511 may use logic circuitry and/or additional processing to verify, to correct, and/or to assign the final polarity of the voltage correction signal unsigned values on the paths 700-706 that may lack a correct polarity prior to transmission through the sign configuration device 511. The sign configuration device 511 may receive indication of the sign bit on the path 674 to be used in polarity verification, correction, and/or assignment. Additionally or alternatively, the sign configuration device 511 may receive indication of the polarities of the weighted tap values transmitted to the local generators 504-510 via the tap bits input on the path 498 and/or via the signals derived from the tap bits input on the path 498 to be used in polarity verification, correction, and/or assignment. Once the sign configuration device 511 verifies, corrects, and/or assigns the final polarity to the voltage correction signal unsigned values on the paths 700-706, the sign configuration device 511 may transmit the corrected values of the voltage correction signal unsigned values on the paths 700-706 as the voltage correction signals 212 and 213.

As described earlier, the voltage correction signals 212 may be transmitted at a terminal 208 to the equalizer 202.

The decoder 204 may use data transmitted on the paths 74-78 to determine the decoded signal 214, assuming the n−1 data is a logical high. The connection between the decoder 204 and the terminal 210 may be made such that when the decoded signal 214 is transmitted to the terminal 210, the correct field effect transistor may be enabled to transmit the correct voltage correction signal to affect output 112 and generate the corrected bit 88. Since the n−1 data is assumed to be a logical high, only half of the binary states possible from four previous bits are transmitted through voltage correction signal 212. The equalizer 292 may operate similarly to equalizer 202, as previously described, and may receive the other half of the binary states possible from four previous bits as the voltage correction signals 213.

Thus, the voltage correction signals 212 and 213 may be generated by the voltage correction signal generator 484 through the processing of the local generators 504-510 using individual resistor stacks 520, individual selector 524, a common decoder 522, and a common sign configuration device 511. As described, the voltage correction signal generator 484 determines the voltage correction signals 212 and 213 all at the same time such that the values may be used for subsequent distortion corrections without recalculating the signals.

It is noted that while one voltage correction signal generator 484 is described herein, one or more voltage correction signal generators 484 may be used in the method of rolling the distorted bit 81. The four duplications of the distortion correction circuit 290, as illustrated with the first circuit 352, the second circuit 354, the third circuit 406, and the fourth circuit 408, may each have an individual voltage correction signal generator 484. In a similar manner as the described voltage correction signal generator 484, duplications of the voltage correction signal generator 484 may be used in the creation of the voltage correction signals 360, 362, 430, 432, 444, and 446. Similarly, in some embodiments, additional circuitry may be used to couple the voltage correction signal generator 484 with the second circuit 354, the third circuit 406, and the fourth circuit 408, and in this way provide the voltage correction signals 212, 213, 360, 362, 430, 432, 444, and 446 from one voltage correction signal generator 484.

Accordingly, the technical effects of the present disclosure include a method of creating voltage correction signals for the purpose of signal distortion correction. The method describes a process to allow for calculation of all combinations of possible distortions before an input signal is received. Thus, the distortion correction values may be ready to modify a distorted input bit without requiring the resources to create the distortion correction value at each instance of the input of distorted bits.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A device, comprising:
    a first local generator circuit configured to create a first group of unsigned voltage correction values based on a reference voltage and a plurality of weighted tap inputs; and
    a sign configuring circuit configured to:
        receive the first group of unsigned voltage correction values from the first local generator circuit; and
        generate a plurality of correction signals using the first group of unsigned voltage correction values, wherein the plurality of correction signals are signed signals selected to offset inter-symbol interference on a bit distorted by one or more previously transmitted bits.

2. The device of claim 1, wherein the first local generator circuit is configured to generate a sign bit used by the sign configuring circuit when generating the correction signals.

3. The device of claim 1, wherein the first local generator circuit comprises a resistor stack that varies its resistance in response to a subset of the plurality of weighted tap inputs.

4. The device of claim 3, wherein the one or more previously transmitted bits comprises a first previously transmitted bit and a second previously transmitted bit, and wherein the subset of the plurality of weighted tap inputs comprises a first weighted tap input corresponding to a first contribution of inter-symbol interference from the first previously transmitted bit independent of a second contribution of inter-symbol interference from the second previously transmitted bit.

5. The device of claim 3, wherein the first local generator circuit comprises a selector circuit configured to select an output from the resistor stack representative of a reference voltage offset to be used at least to partially offset the inter-symbol interference on the bit.

6. The device of claim 1, comprising a second local generator circuit, wherein the second local generator circuit generates a second group of unsigned voltage correction values based on the reference voltage and the plurality of weighted tap inputs.

7. The device of claim 6, wherein the first group of unsigned voltage correction values corresponds to a first binary state framework, and wherein the second group of unsigned voltage correction values corresponds to a second binary state framework differing from the first binary state framework.

8. The device of claim 6, wherein the first local generator circuit comprises a first selector circuit, wherein the second local generator circuit comprises a second selector circuit, and wherein the first selector circuit and the second selector circuit operate based at least in part on a control signal generated based at least in part on a difference between a subset of the plurality of weighted tap inputs.

9. The device of claim 1, wherein the first local generator circuit comprises a selector circuit configured to select a respective voltage correction value from the first group of unsigned voltage correction values based at least in part on a difference between a subset of the plurality of weighted tap inputs.

10. A device, comprising:
    a voltage correction signal generator configured to generate a first subset of correction voltages and a second subset of second correction voltages, wherein the voltage correction signal generator comprises:
  a first local generator configured to generate a first correction voltage corresponding to a first binary state framework;
  a second local generator configured to generate a second correction voltage corresponding to a second binary state framework; and
  a sign configuration device configured to:
    receive the first correction voltage and the second correction voltage;
    perform polarity assignment operations on a plurality of correction voltages comprising the first correction voltage and the second correction voltage to generate a signed first correction voltage and a signed second correction voltage;
    generate the first subset of correction voltages comprising the signed first correction voltage; and
    generate the second subset of correction voltages comprising the signed second correction voltage.

11. The device of claim 10, comprising a decoder configured to generate a sign bit based at least in part on a difference between a first weighted tap voltage and a second weighted tap voltage, wherein the sign configuration device is operable to perform the polarity assignment operations based at least in part on the sign bit.

12. The device of claim 10, comprising:
a first equalizer that receives the first subset of correction voltages;
a second equalizer that receives the second subset of correction voltages; and
selection circuitry configured to select a respective correction voltage from either the first subset of correction voltages or the second subset of correction voltages in response to feedback comprising a state of a previously transmitted bit.

13. The device of claim 10, wherein the first binary state framework corresponds to a first binary sequence comprising a first bit and a second bit, and wherein the second binary state framework corresponds to a second binary sequence comprising at least an inverse of the first bit.

14. The device of claim 10, wherein the voltage correction signal generator comprises the first local generator corresponding to a first binary sequence of 11XX, the second local generator corresponding to a second binary sequence of 00XX, a third local generator corresponding to a third binary sequence of 10XX, and a fourth local generator corresponding to a fourth binary sequence of 01XX.

15. The device of claim 10, wherein the first correction voltage comprises an unsigned voltage value.

16. A method, comprising:
receiving a plurality of correction voltages from a plurality of local generators;
generating a first subset of correction voltages based at least in part on the plurality of correction voltages, wherein the first subset of correction voltages are generated in response to presuming a first bit comprises a logical high value; and
offsetting a inter-symbol interference expected to alter a second bit at least in part by applying a correction voltage from the first subset of correction voltages to a first combinational circuit, wherein the second bit is transmitted after the first bit.

17. The method of claim 16, comprising selecting the correction voltage from the first subset of correction voltages based at least in part on a binary state of the first bit and of a third bit transmitted before the first bit and the second bit.

18. The method of claim 16, wherein the offsetting of the inter-symbol interference expected to alter the second bit comprises:
generating a second subset of correction voltages based at least in part on the plurality of correction voltages, wherein the second subset of correction voltages are generated in response to presuming the first bit comprises a logical low value;
applying the first subset of correction voltages to the first combination circuit;
applying the second subset of correction voltages to a second combinational circuit;
receiving the first bit; and
offsetting the inter-symbol interference expected to alter the second bit at least in part by permitting the first subset of correction voltages to transmit in response to a logical state of the first bit.

19. The method of claim 16, wherein the generating of the first subset of correction voltages comprises:
receiving a reference voltage that compensates a baseline amount of the inter-symbol interference expected to alter the second bit when a previous bitstream is represented by "00" or logical low data, wherein the previous bitstream was transmitted prior to the first bit;
determining the first subset of correction voltages based at least in part on presuming the first bit to comprise the logical high value; and
transmitting the first subset of correction voltages, wherein the first subset of correction voltages comprises respective voltages corresponding to binary states that each include the first bit equaling the logical high value without a second subset of correction voltages corresponding to binary states that include the first bit equaling a logical low value.

20. The method of claim 19, wherein determining the first subset of correction voltages comprises:
receiving a tap bit input and reference voltage at a resistor stack, wherein the resistor stack is operable to change its resistance in response to the tap bit input; and
transmitting a modified reference voltage from the resistor stack after the resistor stack is adjusted based at least in part on the tap bit input, wherein the first subset of correction voltages comprise the modified reference voltage instead of the reference voltage in response to presuming the first bit comprises the logical high value.

* * * * *